(12) United States Patent
Hsieh et al.

(10) Patent No.: US 8,946,987 B2
(45) Date of Patent: Feb. 3, 2015

(54) LIGHT EMITTING DEVICE AND FABRICATING METHOD THEREOF

(71) Applicant: Industrial Technology Research Institute, Hsinchu (TW)

(72) Inventors: Chia-Fen Hsieh, Hsinchu (TW); Chien-Chun Lu, Taipei County (TW); Ya-Hui Chiang, Hsinchu (TW); Chen-Peng Hsu, Kaohsiung (TW); Hung-Lieh Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/730,787

(22) Filed: Dec. 28, 2012

(65) Prior Publication Data

US 2013/0126918 A1    May 23, 2013

Related U.S. Application Data

(63) Continuation-in-part of application No. 12/182,218, filed on Jul. 30, 2008, now Pat. No. 8,368,099.

(30) Foreign Application Priority Data

Nov. 7, 2007    (TW) .................... 96142117 A

(51) Int. Cl.
  *H01J 1/62*    (2006.01)
  *H01J 63/04*   (2006.01)
  *H01L 33/50*   (2010.01)
  *H05B 33/10*   (2006.01)
  *H01L 33/60*   (2010.01)

(52) U.S. Cl.
  CPC .............. *H01L 33/505* (2013.01); *H05B 33/10* (2013.01); *H01L 33/508* (2013.01); *H01L 33/60* (2013.01); *H01L 2933/0041* (2013.01); *H01L 2924/0002* (2013.01)
  USPC ............. 313/512; 313/498; 313/501; 257/80; 257/98; 257/99

(58) Field of Classification Search
  USPC ................ 257/80, 98, 99; 313/498, 501, 503
  See application file for complete search history.

(56) References Cited

U.S. PATENT DOCUMENTS

| 5,959,316 A | 9/1999 | Lowery |
| 6,274,924 B1 | 8/2001 | Carey et al. |
| 6,468,821 B2 * | 10/2002 | Maeda et al. .................. 438/29 |

(Continued)

FOREIGN PATENT DOCUMENTS

| JP | 2004179644 A | 6/2004 |
| TW | 1248220B B | 1/2006 |
| WO | WO-2004/040661 A2 | 5/2004 |

*Primary Examiner* — Thomas A Hollweg
(74) *Attorney, Agent, or Firm* — Rabin & Berdo, P.C.

(57) ABSTRACT

A light emitting device and a fabricating method thereof are described, wherein the light emitting device includes a substrate, a wall, a first LED chip and a light conversion filling. The first LED chip is disposed on a surface of the substrate. The wall is disposed on the surface of the substrate, and surrounds the first LED chip. A first angle between a central axis of the wall and an inner surface of the wall is 0 degree or is acute, a second angle between the central axis of the wall and an outer surface of the wall is 0 degree or is acute, and the outer surface of the wall and the substrate has a space therebetween. The light conversion filling is surrounded by the light conversion wall, and is disposed on the first LED chip.

27 Claims, 26 Drawing Sheets

(56) References Cited

U.S. PATENT DOCUMENTS

| | | |
|---|---|---|
| 6,531,328 B1 | 3/2003 | Chen |
| 6,534,711 B1 * | 3/2003 | Pollack .................. 174/529 |
| 6,642,652 B2 | 11/2003 | Collins, III et al. |
| 6,650,044 B1 | 11/2003 | Lowery |
| 6,696,704 B1 | 2/2004 | Maeda et al. |
| 6,707,069 B2 | 3/2004 | Song et al. |
| 6,737,681 B2 * | 5/2004 | Koda ........................ 257/98 |
| 6,791,259 B1 * | 9/2004 | Stokes et al. ............. 313/503 |
| 6,806,583 B2 | 10/2004 | Koay et al. |
| 6,871,982 B2 * | 3/2005 | Holman et al. ........... 362/331 |
| 6,982,522 B2 * | 1/2006 | Omoto ...................... 313/502 |
| 6,995,402 B2 * | 2/2006 | Ludowise et al. ......... 257/91 |
| 7,049,159 B2 | 5/2006 | Lowery |
| 7,067,893 B2 * | 6/2006 | Mills et al. ............... 257/433 |
| 7,129,638 B2 | 10/2006 | Ng |
| 7,282,853 B2 * | 10/2007 | Yano et al. ................ 313/498 |
| 7,525,127 B2 * | 4/2009 | Hattori et al. ............. 257/99 |
| 7,573,071 B2 * | 8/2009 | Chang ....................... 257/81 |
| 7,808,013 B2 * | 10/2010 | Mendendorp et al. ..... 257/99 |
| 7,915,630 B2 * | 3/2011 | Hattori et al. ............. 257/98 |
| 8,022,426 B2 * | 9/2011 | Chang et al. .............. 257/98 |
| 8,101,966 B2 * | 1/2012 | Yen ............................ 257/99 |
| 8,232,564 B2 * | 7/2012 | Chakraborty .............. 257/88 |
| 8,476,664 B2 * | 7/2013 | Lin et al. ................... 257/98 |
| 8,513,872 B2 * | 8/2013 | Annen et al. .............. 313/501 |
| 8,569,944 B2 * | 10/2013 | Choi et al. ................ 313/501 |
| 2002/0011601 A1 * | 1/2002 | Furukawa et al. ......... 257/98 |
| 2002/0028527 A1 * | 3/2002 | Maeda et al. ............. 438/29 |
| 2002/0187571 A1 | 12/2002 | Collins et al. |
| 2003/0038295 A1 * | 2/2003 | Koda ........................ 257/98 |
| 2003/0201451 A1 * | 10/2003 | Suehiro et al. ............ 257/98 |
| 2003/0230751 A1 * | 12/2003 | Harada ...................... 257/80 |
| 2004/0066140 A1 * | 4/2004 | Omoto ...................... 313/512 |
| 2005/0184638 A1 * | 8/2005 | Mueller et al. ............ 313/485 |
| 2005/0189539 A1 * | 9/2005 | Furukawa et al. ......... 257/40 |
| 2006/0000347 A1 | 1/2006 | Preece |
| 2006/0003477 A1 | 1/2006 | Braune et al. |
| 2006/0006405 A1 | 1/2006 | Mazzochette |
| 2006/0034084 A1 * | 2/2006 | Matsuura et al. .......... 362/293 |
| 2006/0108594 A1 | 5/2006 | Iwasaki et al. |
| 2006/0197098 A1 * | 9/2006 | Aihara ....................... 257/89 |
| 2006/0291246 A1 * | 12/2006 | Hattori et al. ............. 362/614 |
| 2007/0064131 A1 * | 3/2007 | Sawanobori et al. ...... 348/294 |
| 2007/0096131 A1 | 5/2007 | Chandra |
| 2008/0023711 A1 * | 1/2008 | Tarsa et al. ................ 257/98 |
| 2008/0023721 A1 * | 1/2008 | Lee et al. ................... 257/99 |
| 2008/0074032 A1 * | 3/2008 | Yano et al. ................ 313/503 |
| 2008/0093978 A1 * | 4/2008 | Mori .......................... 313/498 |
| 2009/0039365 A1 * | 2/2009 | Andrews et al. .......... 257/98 |
| 2009/0057690 A1 * | 3/2009 | Chakraborty .............. 257/88 |
| 2009/0108269 A1 * | 4/2009 | Negley et al. ............. 257/88 |
| 2009/0114929 A1 * | 5/2009 | Lee et al. ................... 257/88 |
| 2009/0267090 A1 * | 10/2009 | Chang et al. .............. 257/89 |
| 2009/0315053 A1 * | 12/2009 | Lee et al. ................... 257/98 |
| 2010/0073917 A1 * | 3/2010 | Loh et al. .................. 362/97.3 |
| 2010/0081218 A1 * | 4/2010 | Hardin ....................... 438/7 |
| 2010/0127293 A1 * | 5/2010 | Sommer et al. ........... 257/98 |
| 2010/0134043 A1 * | 6/2010 | Kadotani et al. .......... 315/294 |
| 2010/0172120 A1 | 7/2010 | Wegh et al. |
| 2010/0264448 A1 * | 10/2010 | Choi et al. ................ 257/98 |
| 2010/0327303 A1 * | 12/2010 | Cheng ....................... 257/98 |
| 2011/0001151 A1 * | 1/2011 | Le Toquin ................. 257/98 |
| 2011/0084296 A1 * | 4/2011 | Cheng ....................... 257/98 |
| 2011/0241033 A1 * | 10/2011 | Nagai ........................ 257/88 |
| 2011/0273079 A1 * | 11/2011 | Pickard et al. ............ 313/483 |
| 2011/0291114 A1 * | 12/2011 | Cheng ....................... 257/88 |
| 2012/0081033 A1 * | 4/2012 | Sun et al. ................... 315/294 |
| 2012/0214264 A1 * | 8/2012 | Lin et al. ................... 438/27 |
| 2012/0235192 A1 * | 9/2012 | Lin et al. ................... 257/98 |

* cited by examiner

US 8,946,987 B2

LIGHT EMITTING DEVICE AND FABRICATING METHOD THEREOF

CROSS-REFERENCE TO RELATED APPLICATIONS

This non-provisional application claims priority under 35 U.S.C. §119(a) on Patent Application No(s). 096142117 filed in Taiwan, R.O.C. on Nov. 7, 2007 the entire contents of which are hereby incorporated by reference.

TECHNICAL FIELD

The disclosure relates to a light emitting device, and more particularly to a light emitting device and a fabricating method thereof.

BACKGROUND

White light spectrum is a successive spectrum, and the white light viewable by human eye is formed by mixing lights with at least two or more colors (wavelengths), for example, the white light can be formed by mixing three primary colors (red light+green light+blue light), or can be formed by mixing complementary colors, such as (blue light+yellow light) or (cyan light+red light). According to the principle of forming the white light, recently, the white light emitting diodes (LEDs) can be approximately classified into two types. The first type is a white LED of three primary color type, which is composed of three semiconductor chips respectively emitting red light, green light, and blue light, and is also referred to as a multi-chip white LED or a triple wavelength white LED. The other type is a white LED of complementary color type, in which a single LED chip emitting a light ray with a single color is used, and fluorescent powder capable of being excited by the color light ray to emit a light ray with a color complementary to that of the color light ray, so it is also referred to as a single-chip white LED. However, when using the multi-chip white LED, the difference of the semiconductor materials results in the difficulty on the design of drive circuit.

Referring to FIG. 1, a schematic diagram of a conventional single-chip white LED is shown. In the single-chip white LED, fluorescent powder and gel are formulated according to a specific ratio to form a light conversion filling 10, and the light conversion filling 10 directly surrounds an LED chip 13 and fills up a cup 14. Therefore, when the LED chip 13 emits light, generated light pass through the light conversion filling 10, and blue light emitted by the LED chip 13 and yellow light excited from the light conversion filling 10 by the blue light are mixed to obtain the white light. For the light emitted in different angles from the LED chip 13, the paths to the light conversion filling 10 vary, and the distances for the light to pass through the light conversion filling 10 are different. The light ray 111 with a larger incident angle passes through the light conversion filling 10 and is redirected by the reflective wall 15. The path distance of passing through the light conversion filling 10 is longer; therefore, the energy is mostly converted to the yellow light excited from the light conversion filling 10 and forms the white light similar to the yellow light on the periphery of the cup 14. Accordingly, the single-chip white LED shows an annular yellow light region on the periphery of the emitted white light, that is, halo phenomenon. The light ray 112 with a smaller incident angle emits upwardly without being redirected, so that the path of passing through the light conversion filling 10 is shorter, and the energy is mostly at the blue light emitted by the LED chip 13. Consequently, when the single-chip white LED is measured, it is found that color temperatures are different at different positions, and the difference of the color temperatures can be up to 700 K at most, thus resulting in a problem of non-uniform color temperature of the emitted light ray.

Referring to FIG. 2, a schematic diagram of a conventional multi-chip white LED is shown. In the multi-chip white LED, fluorescent powder and gel are formulated according to a specific ratio to form a light conversion filling 20, and the light conversion filling 20 directly surrounds LED chips 18a, 18b, and 18c, and fills up a cup 19. In addition to the halo phenomenon mentioned in the single-chip white LED, the phenomenon of non-uniform color temperature is obvious to be detected by viewing from the top of the cup 19, since mostly the light emitted from the surface of the chip in the multi-chip white LED passes through the light conversion filling 20 upwardly, whereas the light emitted by two chips pass through the light conversion filling 20 in-between chips at the same time, so that the color temperature of the light emitted between the chips is lower than that of the light emitted from the surface of chip.

Theoretically, same color temperature could be achieved by having the emitting blue light pass through the equal distance of the fluorescent material. Accordingly, solutions as to forming the uniform thickness of fluorescent material are fervently discussed and proposed. In the U.S. Pat. No. 5,959,316, entitled "Multiple en-capsulations of phosphor-LED devices", a transparent hemispherical spacer of resin is formed and fixed first for fluorescent material to flow to conform to shape. The layer of fluorescent material is claimed to be uniform thickness; however, arrangement as mentioned will make the manufacturing process difficult to implement. In the U.S. Pat. No. 7,129,638, entitled "Light emitting devices with a phosphor coating having evenly dispersed phosphor particles and constant thickness", a fixed fluorescence conversion layer is formed by uniformly sub-siding the fluorescent powder with gel on the LED chip before the gel is cured. The material selection and complex manufacturing process will limit the application. In the U.S. Pat. No. 6,650,044, entitled "Stenciling phosphor layers on light emitting diodes", the problem of unequal color temperature is effectively resolved by disposing the phosphor layer of uniform thickness around the chip surface through conformal packaging. Due to the manufacturing process, the eligible method of packaging will be limited to flip chip, waiving the use of wire bond, so that the breaking of wire bond could be saved. In the Japan patent 2004-179644 "PHOSPHOR LAMINATION AND LIGHT SOURCE USING THE SAME", the problem of unequal color temperature is also effectively resolved by adhering the fluorescence conversion layer with uniform thickness to the chip surface through screen printing. This conformal packaging again suits merely to the flip chip owing to the manufacturing process. In the patent US2006/0003477 (WO2004040661) entitled "METHOD FOR PRODUCING A LIGHT SOURCE PROVIDED WITH ELECTROLUMINESCENT DIODES AND COMPRISING A LUMINESCENCE CONVERSION ELEMENT", the desired effect of same color temperature, though possible, is achieved painstakingly by controlling the machines and manufacturing process precisely. Furthermore, the manufacturing process has to be executed directly on the LED chip.

SUMMARY

The disclosure relates to a light emitting device including a substrate, a light conversion wall, a first LED chip and a light conversion filling. The first LED chip is disposed on a surface of the substrate. The light conversion wall is disposed on the surface of the substrate, and surrounds the first LED chip. A first angle between a central axis of the wall and an inner surface of the wall is 0 degree or is acute. A second angle between the central axis of the wall and an outer surface of the wall is 0 degree or is acute. The outer surface of the wall and the substrate has a space therebetween. The light conversion filling is surrounded by the light conversion wall, and is disposed on the first LED chip.

The disclosure relates to a fabricating method of a light emitting device, and the fabricating method includes the following steps. A first LED chip is disposed on a surface of a substrate. A wall is formed on the surface of the substrate. The wall surrounds the first LED chip and associates to a first color temperature. An outer surface of the wall and the substrate has a space therebetween. A light conversion filling is formed in a space surrounded by the light conversion wall, according to the first color temperature. The light conversion filling is disposed on the first LED chip and associates to a second color temperature different from the first color temperature.

BRIEF DESCRIPTION OF THE DRAWINGS

The present disclosure will become more fully understood from the detailed description given herein below for illustration only, and thus does not limit the present disclosure, wherein.

DETAILED DESCRIPTION

Figure 1:
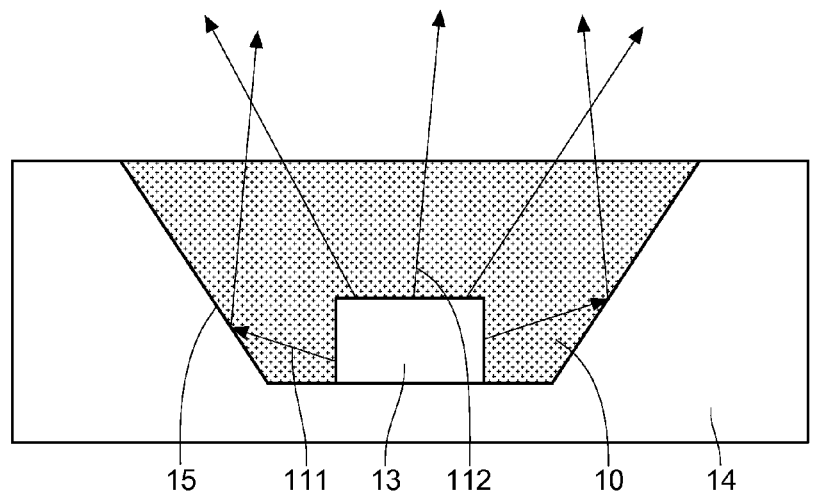
FIG. 1 is a schematic diagram of a conventional single-chip white LED.
Figure 2:
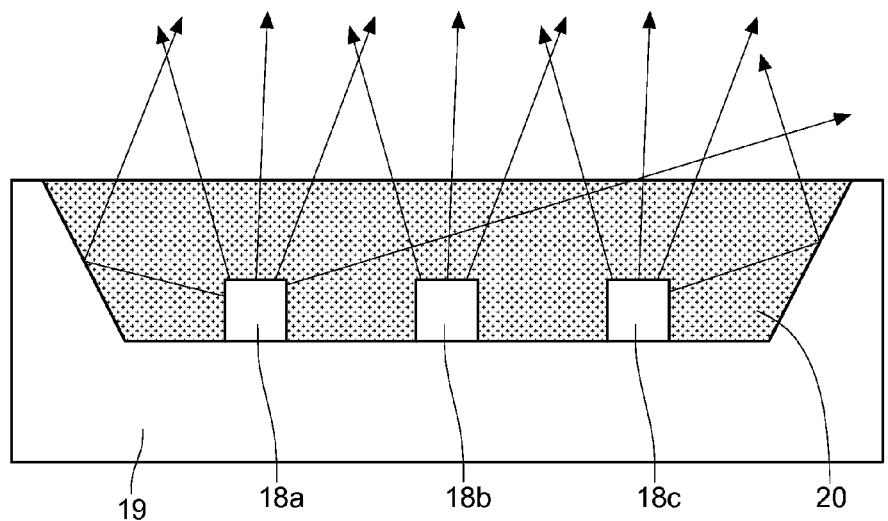
FIG. 2 is a schematic diagram of a conventional multi-chip white LED.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure provides a light emitting device with a wall surrounding at least one LED chip, so as to emit uniform light. The method of forming the light conversion wall can be, for example, photolithography process, laser writing process, mold pressing, an etching manner, or injection molding.

To clearly describe the disclosure, the injection molding manner is taken as an example. The embodiments described below use the same label for representing the same or similar components.

Figure 3A:
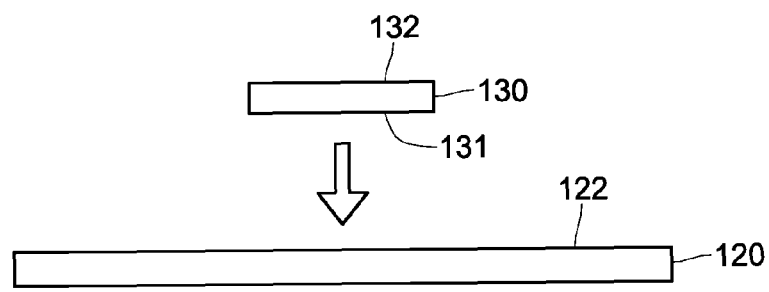
FIG. 3A to FIG. 3F are schematic diagrams showing a manufacture process of a light emitting device of an embodiment of the disclosure.

FIG. 3A to FIG. 3F illustrate a manufacture process of a light emitting device according to an embodiment of the disclosure. Firstly, a LED chip 130 (the first LED chip) is formed on a substrate 120 as shown in FIG. 3A. The surface 131 of the LED chip 130 joins the surface 122 of the substrate 120, and the surface 122 is opposite to the surface 121.

Figure 3B:
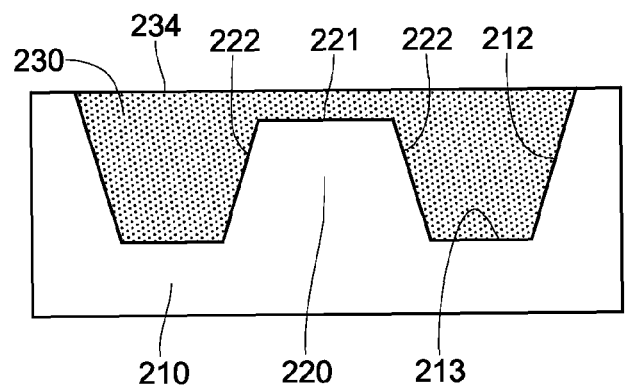

On the other hand, a mold 210 is filled with a first light conversion package gel serving as a light conversion wall 230 (also named "wall") as shown in FIG. 3B. The mold 210 has a recess, and the recess has an opening and a bulge 220. The bulge 220 is at a preset location of the bottom surface 213 of the recess. The opening of the recess allows the first package gel to be disposed in after a hydrophobic layer is formed on the bottom surface 213 and the side surface 212 of the recess, and on the side surface 222 and the top surface 221 of the bulge 220. The preset location can be designed according to various application requirements. The top surface 221 of the bulge 220 can be designed to be lower than the liquid level 234 of the first package gel, according to various application requirements. Moreover, the side surface 222 of the bulge 220 and the side surface 211 of the recess can be designed to be vertical or not vertical to the bottom surface 213 of the recess according to various application requirements.

Figure 3C:
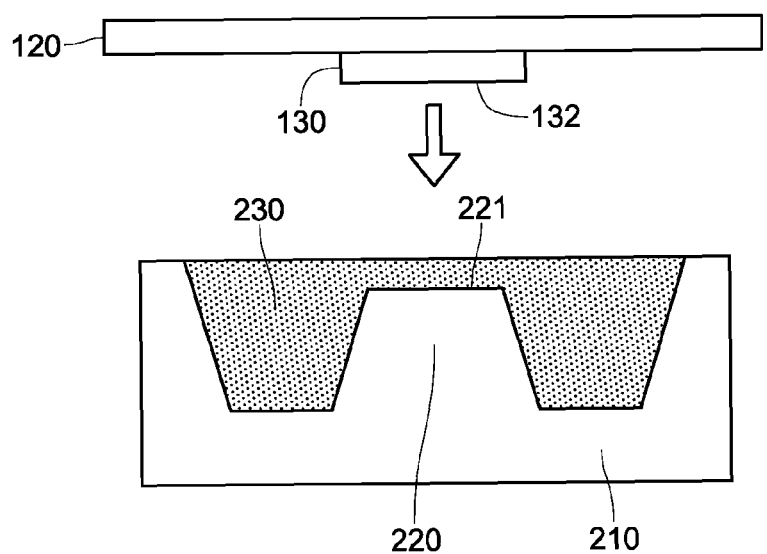
Figure 3D:
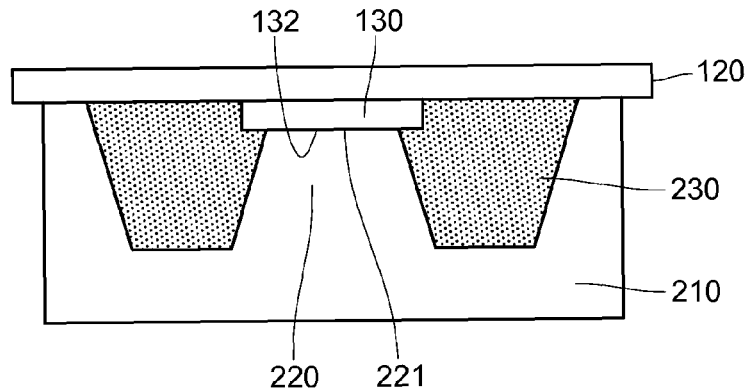

Subsequently, the first structure, which includes the substrate 120 and the LED chip 130, covers the second structure, which includes the mold 210 and the first light conversion package gel, from the opening of the recess in the mold 210 as shown in FIG. 3C. The first light conversion package gel on the top surface 221 may be pushed aside by the LED chip 130, so as to enclose the LED chip 130 and the first light conversion package gel serving as the light conversion wall 230 between the substrate 120 and the mold 210 as shown in FIG. 3D. In this embodiment, the preset location of the bulge 220 corresponds to the LED chip 130, and the surface 132 of the LED chip 130 is attached on the top surface 221.

Figure 3E:
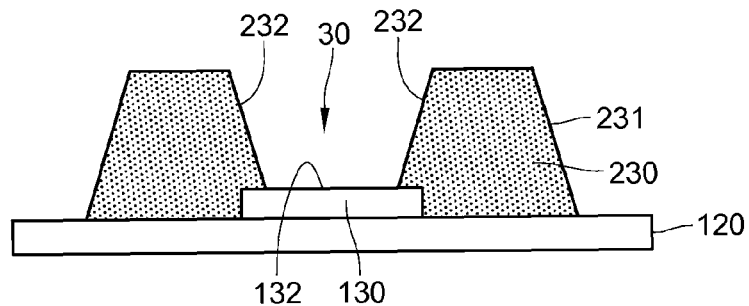
Figure 3F:
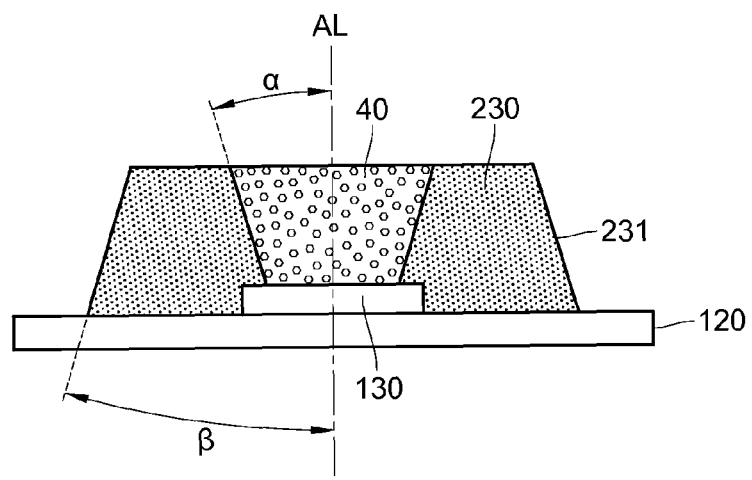

After the first package gel is solidified, the mold 210 is removed as shown in FIG. 3E. Herein, the light conversion wall 230 is formed on the substrate 120, surrounds the LED chip 130, and partially covers the LED chip 130. The remnant of the first package gel may exit on the surface 132 of the LED chip 130. An opening 30 is formed between the light conversion wall 230 and the LED chip 130. A second light conversion package gel serving as a light conversion filling 40 is disposed in the rest of the space surrounded by the light conversion wall 230 is filled with as shown in FIG. 3F.

Specifically, the inner surface 232 of the light conversion wall 230 and a central axis AL of the light conversion wall 230 have a first angle α therebetween, and the outer surface 231 of the light conversion wall 230 and the central axis AL of the light conversion wall 230 have a second angle β therebetween. The first angle α and the second angle β are acute angles and can be, for example, 0 to 60 degree. The central line AL is at a geometric central point of the axis section of the light conversion wall 230 and is vertical to the surface 122 of the substrate 120.

Figure 4A:
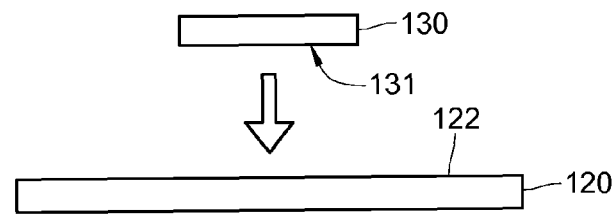
FIG. 4A to FIG. 4F are schematic diagrams showing a manufacture process of a light emitting device of an embodiment of the disclosure.

FIG. 4A to FIG. 4F illustrate a manufacture process of a light emitting device according to an embodiment of the disclosure. Firstly, a LED chip 130 is formed on the surface 122 of the substrate 120 as shown in FIG. 4A. The surface 131 of the LED chip 130 joins the surface 122 of the substrate 120.

Figure 4B:
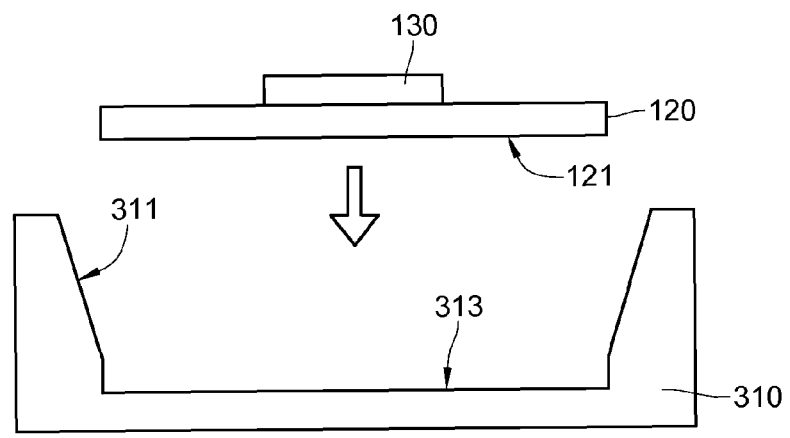

Subsequently, the first structure including the substrate 120 and the LED chip 130 is disposed in a recess of a mold 310 after a hydrophobic layer is formed on the side surface 311 and the bottom surface 313 of the recess of the mold 310, as shown in FIG. 4B. The mold 310 has the recess within, and the recess has an opening. Therefore, the first structure is allowed to be disposed in the recess from the opening. The side surface 311 is vertical to or not vertical to the bottom surface 313 according to various application requirements. The surface 121 of the substrate 120 is attached on the bottom surface 313 of the recess.

Figure 4C:
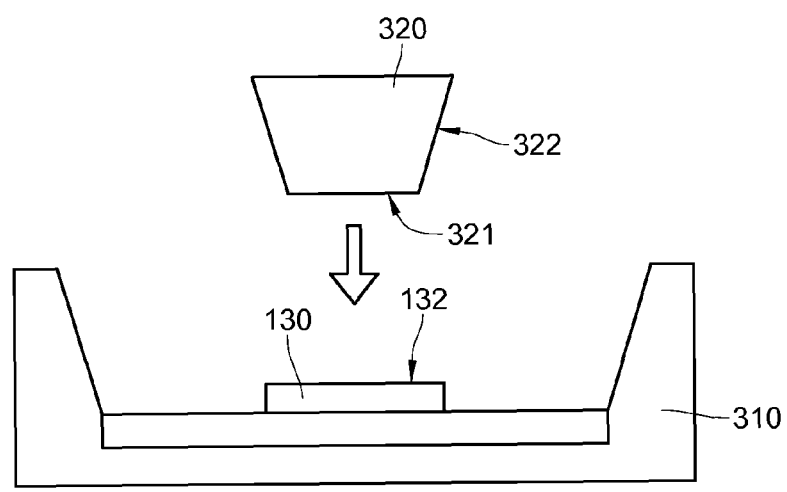

As shown in FIG. 4C, a bulge 320 is disposed on the LED chip 130 after a hydrophobic layer is formed on the side surface 322 and the bottom surface of the bulge 320. The bottom surface of the bulge 320 attaches the surface 132 of the LED chip 130. The side surface of the bulge 320 is vertical to or not vertical to the surface 122 of the substrate 120 (the surface 132 of the LED chip 130) according to various application requirements.

Figure 4D:
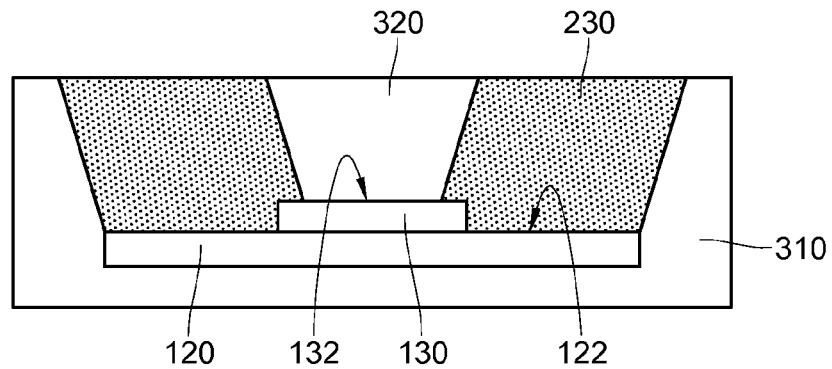

A first package gel serving as the light conversion wall 230 is disposed in the rest of the recess in the mold 310 as shown in FIG. 4D. The first package gel covers the LED chip 130 partially and covers the rest of the surface 122 of the substrate 120.

Figure 4E:
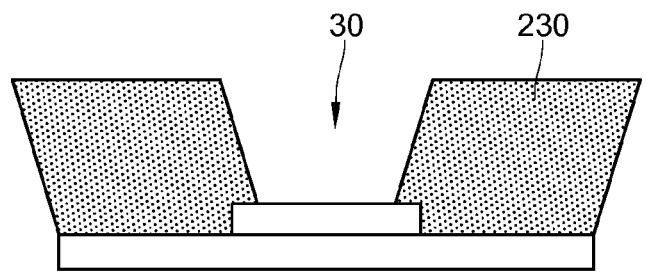

After solidifying the first package gel, the mold 310 and the bulge 320 are removed as shown in FIG. 4E. Therefore, the light conversion wall 230 is formed on the substrate 120 and partially covers the LED chip 130. The light conversion wall 230 surrounds the LED chip 130. Herein, an opening (or a space) between the light conversion wall 230 and the LED chip 130 is formed.

Figure 4F:
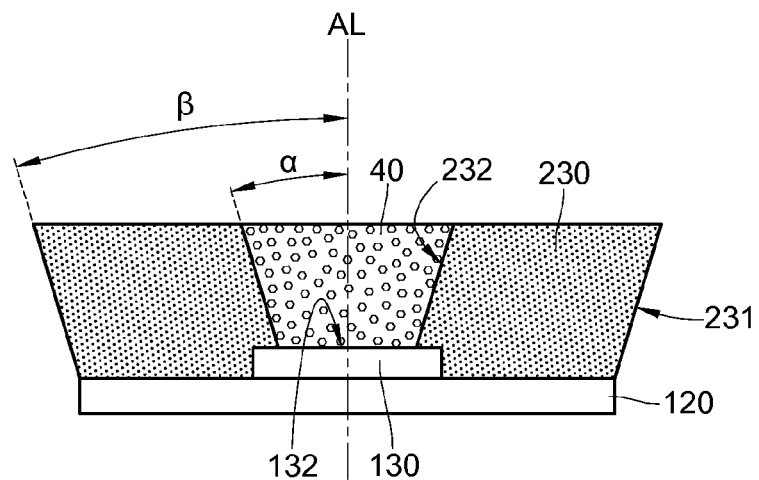

Afterward, a second light conversion package gel serving as a light conversion filling 40 is disposed in the rest of the space surrounded by the light conversion wall 230 and covers the surface 132 of the LED chip 130, as shown in FIG. 4F. After solidifying the second light conversion package gel, the light conversion filling 40 is formed.

Figure 5A:
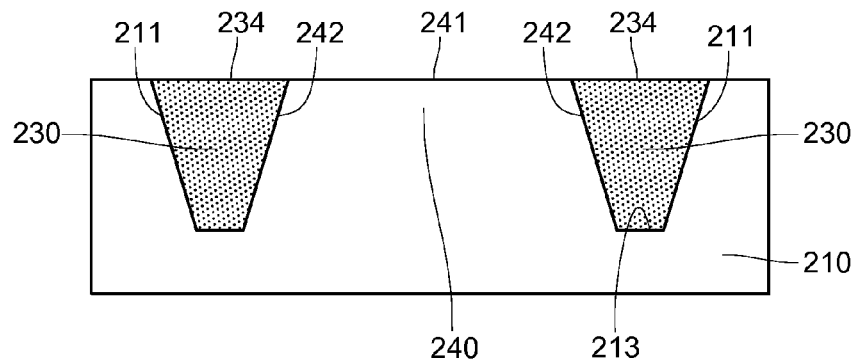
FIG. 5A to FIG. 5F are schematic diagrams showing a manufacture process of a light emitting device of an embodiment of the disclosure.

FIG. 5A to FIG. 5F illustrates a manufacture process of a light emitting device according to an embodiment of the disclosure. Firstly, A first package gel serving as a light conversion wall 230 is disposed in a recess of a mold 210 as shown in FIG. 5A. The mold 210 has the recess, and the recess has a bulge 240 and an opening. The bulge 240 is at a preset location of the bottom surface 213 of the recess. Therefore, the recess allows the first light conversion package gel to be disposed in from the opening. The preset location can be designed according to various application requirements. The level of the top surface 241 of bulge 240 can be designed to be equal to the liquid level 234 of the first light conversion package gel according to various application requirements. Moreover, the side surface 242 of the bulge 240 and the side surface 211 of the recess can be designed to be vertical or not vertical to the bottom surface 213 of the recess according to various application requirements.

Figure 5B:
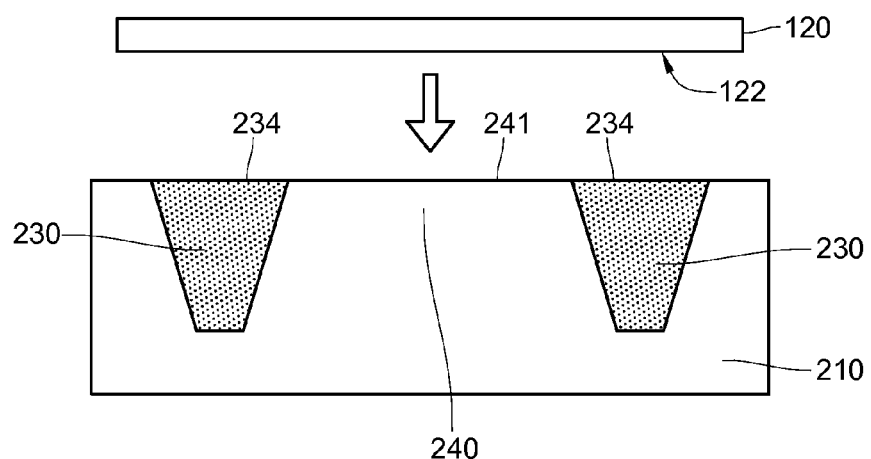
Figure 5C:
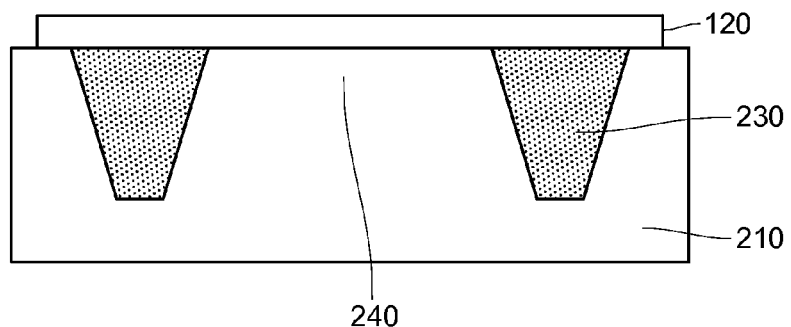

Subsequently, a substrate 120 covers the first structure including the mold 210 and the first light conversion package gel, as shown in FIG. 5B, so as to enclose the first light conversion package gel between the substrate 120 and the mold 210 as shown in FIG. 5C. In this embodiment, the surface 122 of the substrate 120 joins the top surface 241 and the liquid level 234.

Figure 5D:
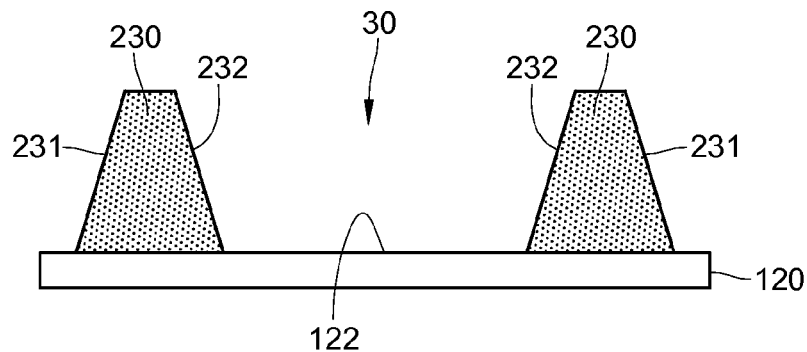
Figure 5E:
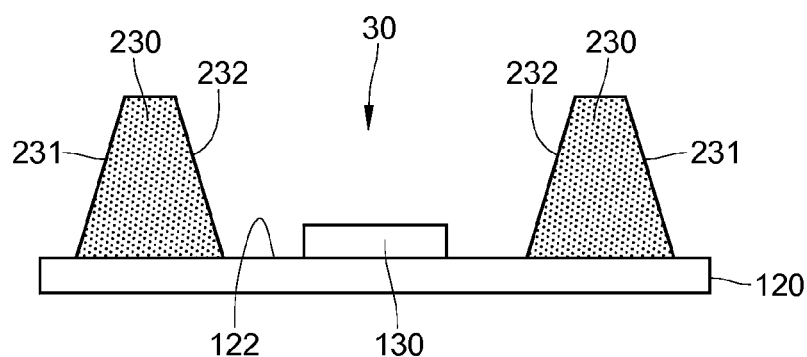
Figure 5F:
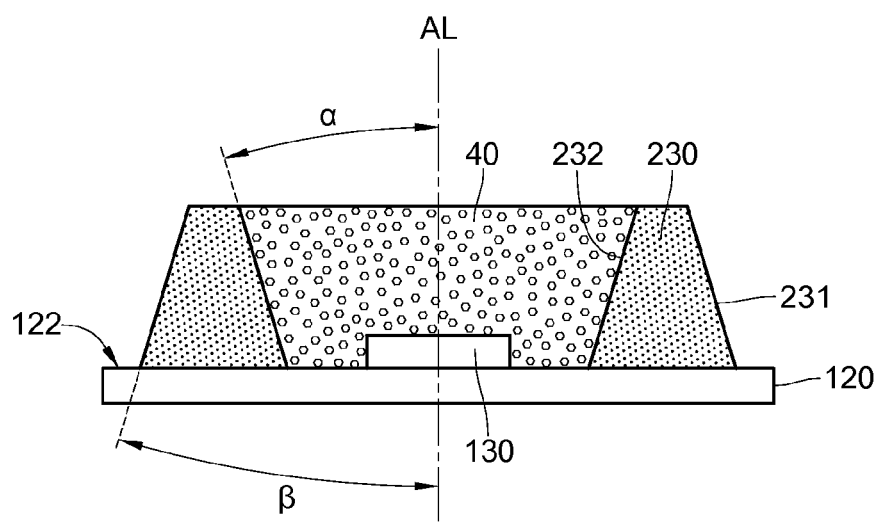

After the first light conversion package gel is solidified, the mold 210 is removed as shown in FIG. 5D. Herein, the light conversion wall 230 is formed on the substrate 120. A space is surrounded by the light conversion wall 230 and has an opening 30 opposite to the substrate 120. Furthermore, a LED chip 130 is disposed on the surface 122 of the substrate 120 as shown in FIG. 5E. Afterward, a second light conversion package gel serving as a light conversion filling 40 is disposed in the rest of the space surrounded by the light conversion wall 230 as shown in FIG. 5F. After solidifying the second light conversion package gel, the light conversion filling 40 is formed.

Figure 6A:
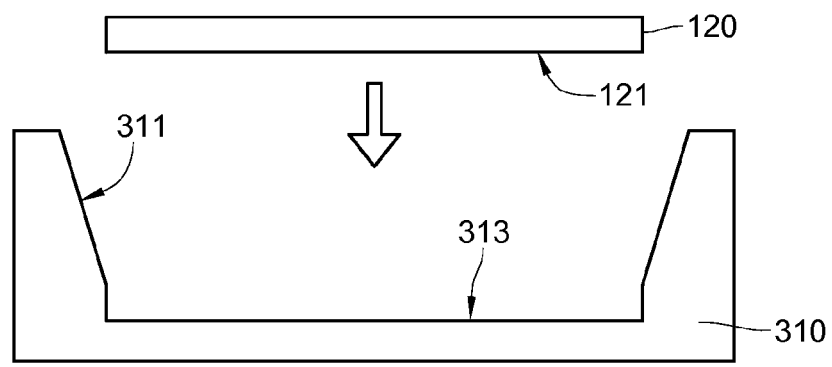
FIG. 6A to FIG. 6F are schematic diagrams showing a manufacture process of a light emitting device of an embodiment of the disclosure.

FIG. 6A to FIG. 6F illustrate a manufacture process of a light emitting device according to an embodiment of the disclosure. As shown in FIG. 6A, a mold 310 is provided, and a substrate 120 is disposed in a recess within the mold 310. The mold 310 can be, for example, a cup mold, and has the recess having an opening. Therefore, the mold 310 allows the substrate 120 to be disposed in the recess from the opening after a hydrophobic layer is formed on the bottom surface 313 and the side surface of the recess. The surface 121 of the substrate 120 attaches the bottom surface 313 of the recess.

Figure 6B:
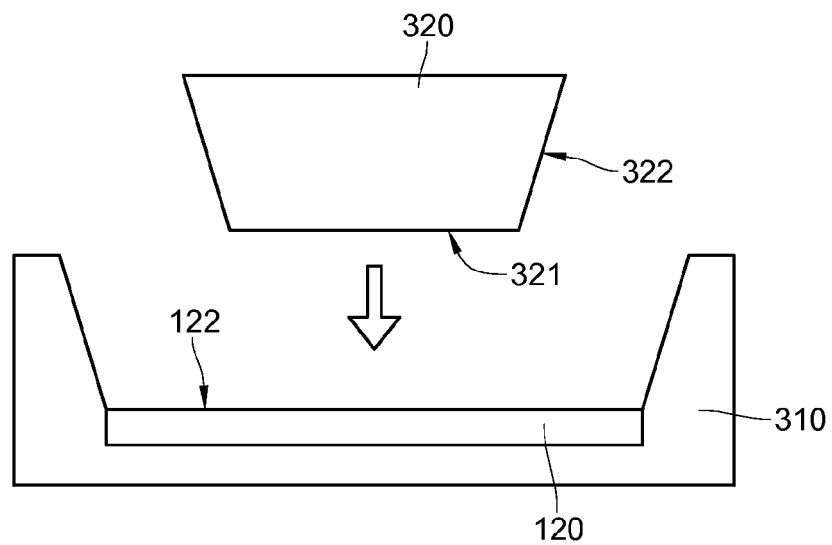

Subsequently, a bulge 320 is disposed on the surface 122 of the substrate 120 after a hydrophobic layer is formed on the side surface 322 and the bottom surface 321 of the bulge 320 as shown in FIG. 6B. The bottom surface 321 of the bulge 320 attaches the surface 122 of the substrate 120.

Specifically, the side surface 311 of the recess is vertical to or not vertical to the bottom surface 313 of the recess (or the surface 122 of the substrate 120) according various application requirements. The side surface 322 of the bulge 320 is vertical to or not vertical to the bottom surface of the bulge 32 according to various application requirements.

Figure 6C:
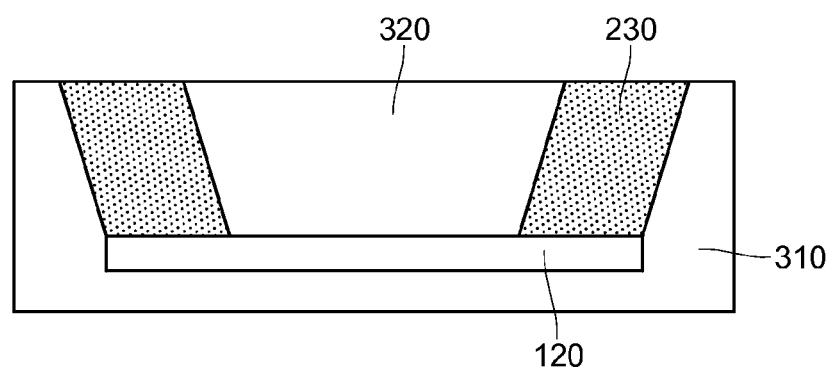
Figure 6D:
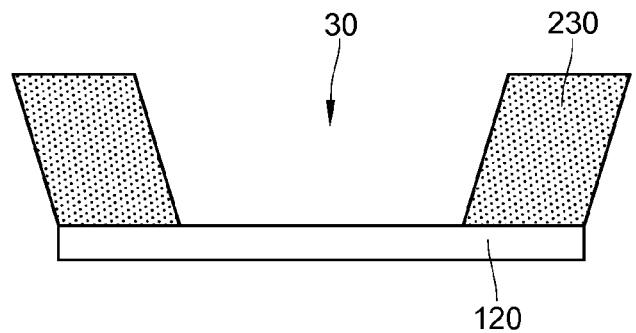

Furthermore, a first gel serving as a light conversion wall 230 is disposed in the rest of the recess within the mold 310 as shown in FIG. 6C. After solidifying the first package gel, the mold 310 and the bulge 320 are removed as shown in FIG. 6D. Thus, the light conversion wall 230 is formed on the substrate 120. A space surrounded by the light conversion wall 230 has an opening 30 opposite to the substrate 120.

Figure 6E:
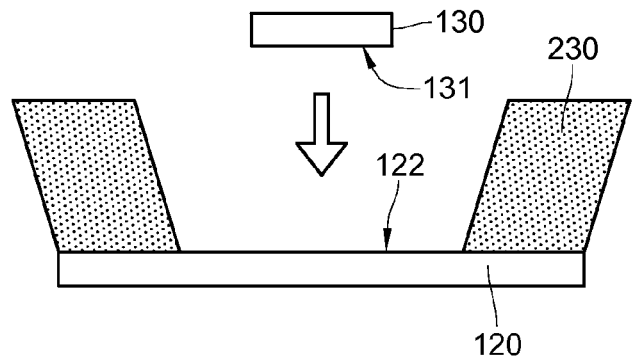
Figure 6F:
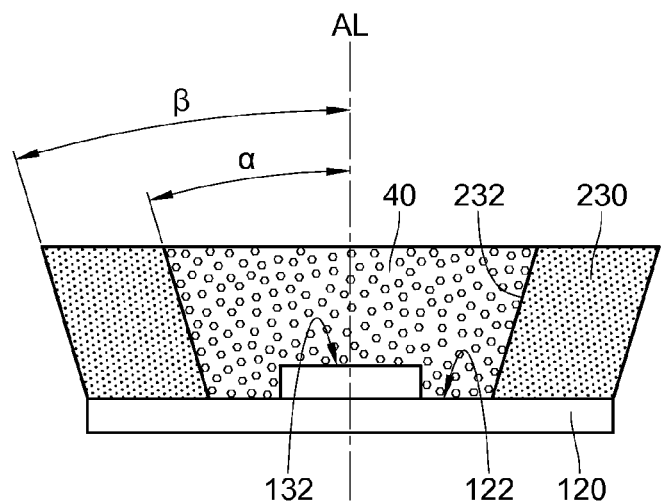

As shown in FIG. 6E, a LED chip 130 is disposed on a preset location of the surface 122 of the substrate 120 surrounded by the light conversion wall 230. Afterward, a second light conversion package gel serving as a light conversion filling 40 is disposed in the rest of the space surrounded by the light conversion wall 230 from the opening 30 as shown in FIG. 6F. After solidifying the second light conversion package gel, the light conversion filling 40 is formed. In this disclosure, the inner surface 232 and the outer surface 231 of the light conversion wall 230 respectively form a first angle α and a second angle β with a central axis AL of the light conversion wall 230 through a corresponding manufacture in FIG. 3A to FIG. 3F, FIG. 4A to FIG. 4F, FIG. 5A to FIG. 5F, or FIG. 6A to FIG. 6F. The first angle α and the second angle β can be 0 degree or acute angles, and the acute angle can be, for example, more than 0 degree and equal to or smaller than 60 degree.

Figure 7A:
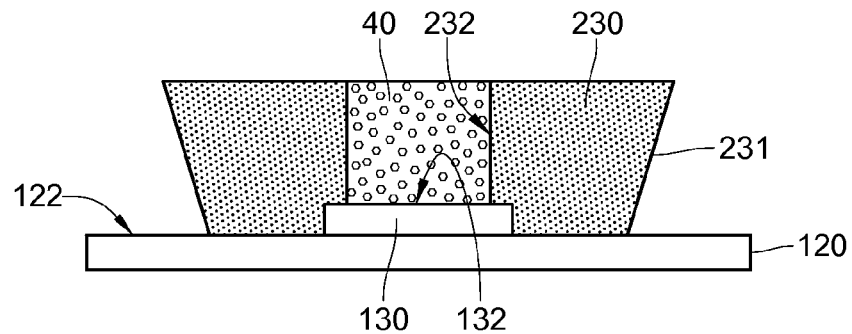
FIG. 7A is a sectional diagram of the light emitting device according to an embodiment of the disclosure.
Figure 7B:
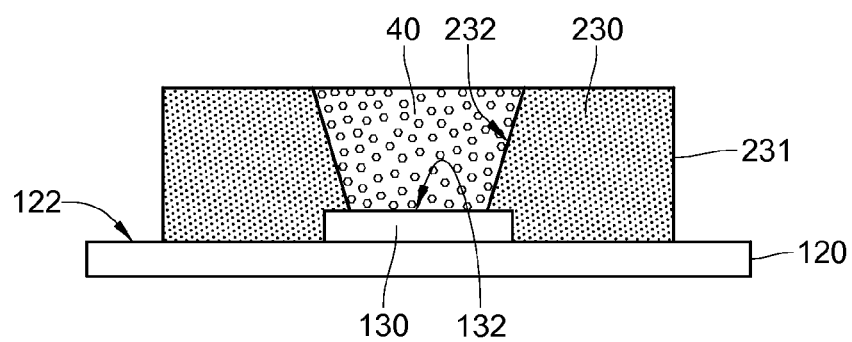
FIG. 7B is a sectional diagram of the light emitting device according to an embodiment of the disclosure.
Figure 7C:
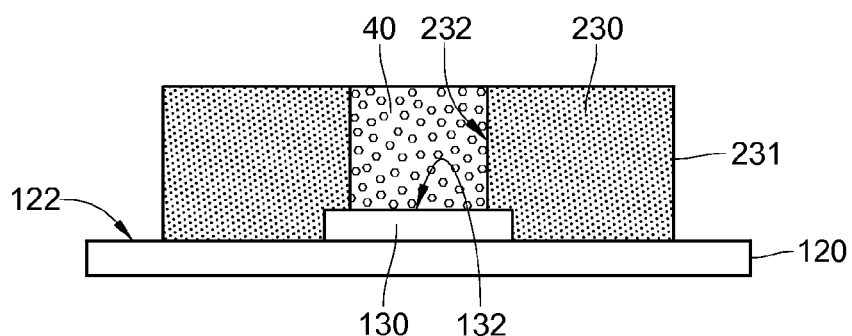
FIG. 7C is a sectional diagram of the light emitting device according to an embodiment of the disclosure.
Figure 8A:
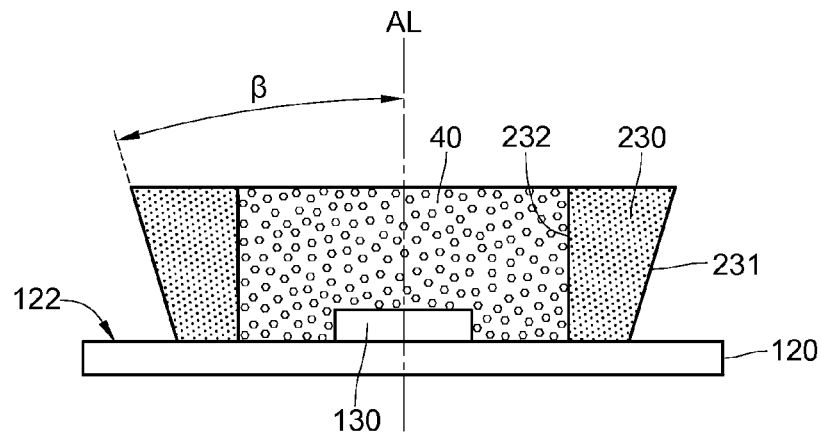
FIG. 8A is a sectional diagram of the light emitting device according to an embodiment of the disclosure.
Figure 8B:
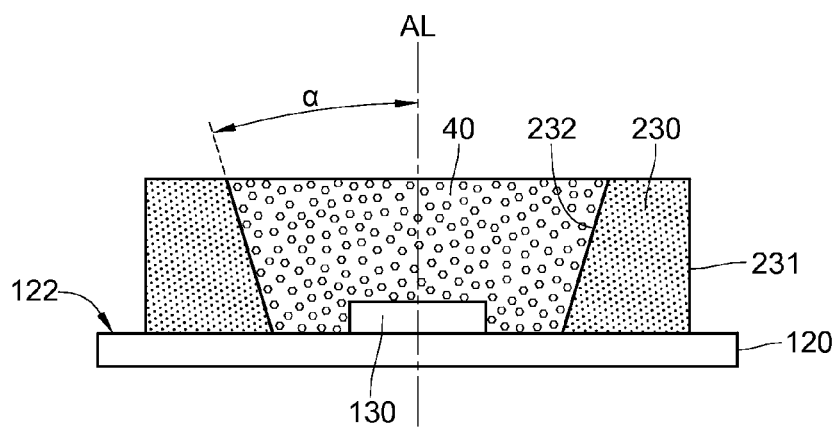
FIG. 8B is a sectional diagram of the light emitting device according to an embodiment of the disclosure.
Figure 8C:
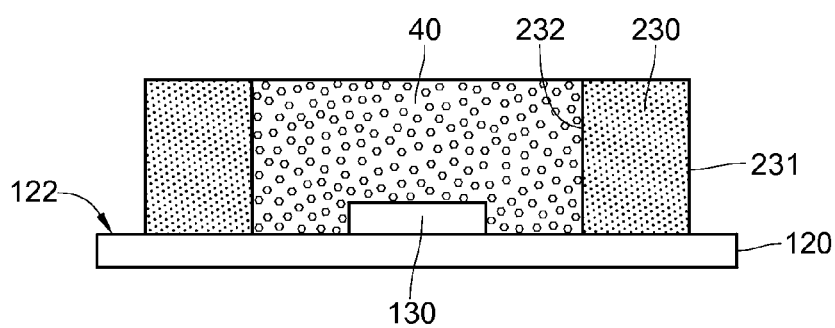
FIG. 8C is a sectional diagram of the light emitting device according to an embodiment of the disclosure.

For example, as shown in FIGS. 3F, 4F, 5F and 6F, both of the range of the first angle α and the second angle β can be greater than 0 degree but smaller than or equal to 60 degree. The first angle α and the second angle β can be the same. Specifically, the inner surface 232 and the outer surface 231 of the light conversion wall 230 are horizontal as shown in FIG. 4F and FIG. 6F, and the inner surface 232 and the outer surface 231 of the light conversion wall 230 are non-horizontal as shown in FIG. 3F and FIG. 5F. For example, as shown in FIG. 7A and FIG. 8A, the first angle α can be 0 degree, and the range of the second angle β can be greater than 0 degree but smaller than or equal to 60 degree. For example, as shown in FIG. 7B and FIG. 8B, the range of the first angle α can be greater than 0 degree but smaller than or equal to 60 degree, and the second angle β can be 0 degree. For example, as shown in FIG. 7C and FIG. 8C, both of the first angle α and the second angle β can be 0 degree.

In the disclosure, the substrate 120 is made of a heat conductive material, and the material of the substrate 120 can be, for example, ceramic, metal, organic polymer, or silicon. The LED chip 130 can be replaced by a laser diode (LD) chip.

On the other hand, the light conversion wall 230 has a first fluorescent material, and the light conversion filling 40 has a second fluorescent material. The second fluorescent material of the light conversion filling 40 converts the light emitted by the LED chip 130, and the first fluorescent material of the light conversion wall 230 converts the light which travels from the light conversion filling 40. The fluorescent material, for example, can be a fluorescent powder or multiple fluorescent powers.

In some embodiments, the second refractive index of the light conversion filling 40 is greater than the first refractive index of the light conversion wall 230, so that the total reflection may occur at the interface of the light conversion wall 230 and the light conversion filling 40. This causes that light emitted by the light conversion filling 40 may be redirected in the same direction.

In some embodiments, the second color temperature of the light emitted from the liquid level 41 of the light conversion filling 40 is smaller than the first color temperature of the light emitted from the top surface 233 of the light conversion wall 230. After forming the light conversion wall 230 associating to the first color temperature, the light conversion filling 40 is formed according to the first color temperature. That is, the second color temperature associating to the light conversion filling 40 is set according to the first color temperature. Thus, a preset color temperature of the light emitting device can be achieved through this process.

In an example of a light emitting device having an average color temperature of 4000 K, the second color temperature of the light conversion filling 40 is, for example, less than or equal to 4000K, the first color temperature of the light conversion wall 230 is, for example, greater than or equal to 6500 K. The average color temperature is an average value of the first and second color temperatures.

In some embodiments, the color of the light emitted by the second fluorescent material is different from the color of the light emitted by the first fluorescent material. For example, the first fluorescent material is yellow fluorescent powder, and the second fluorescent material is the combination of yellow fluorescent powder and red fluorescent powder. For example, the first fluorescent material is the combination of yellow fluorescent powder and red fluorescent powder, and the second fluorescent material is red fluorescent powder. For example, the second fluorescent material of the light conversion filling 40 can be excited by the light having the wavelength range between 530 and 580 nm, and the first fluorescent material of the light conversion wall 230 can be excited by the light having the wavelength range between 580 and 640 nm.

Figure 19:
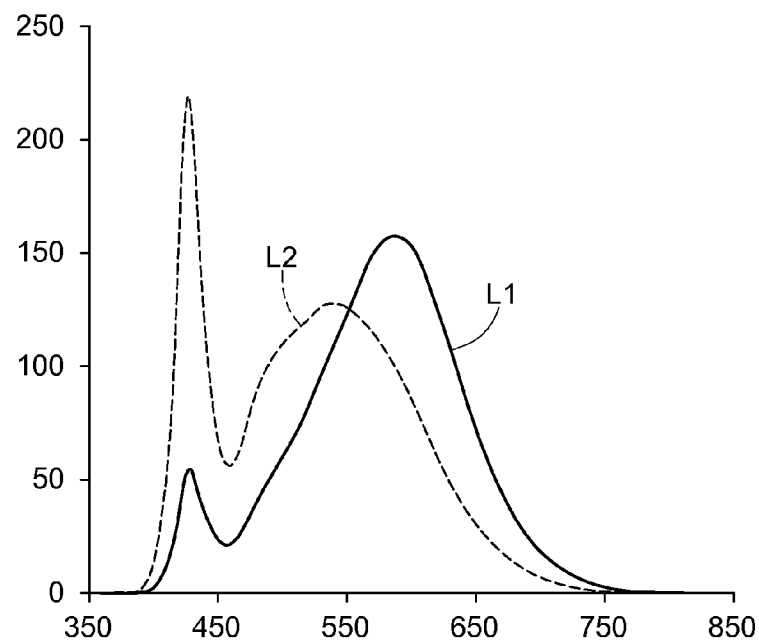
FIG. 19 is a spectrum diagram of the light emitting device in FIG. 7B when a fluorescent material of the light conversion wall is different from a fluorescent material of the light conversion filling.

The spectrums of the light conversion filling 40 and the light conversion wall 230 are shown in FIG. 19, where the curve L1 shows the spectrum of the light conversion filling 40 having the second color temperature of about 2700K, the curve L2 shows the spectrum of the light conversion wall 230 having the first color temperature of about 6500K.

In some embodiments, the second fluorescent material of the light conversion filling 40 and the first fluorescent material of the light conversion wall 230 are the same, but the concentration of the second fluorescent material of the light conversion filling 40 is different from the concentration of the first fluorescent material of the light conversion wall 230.

Figure 20:
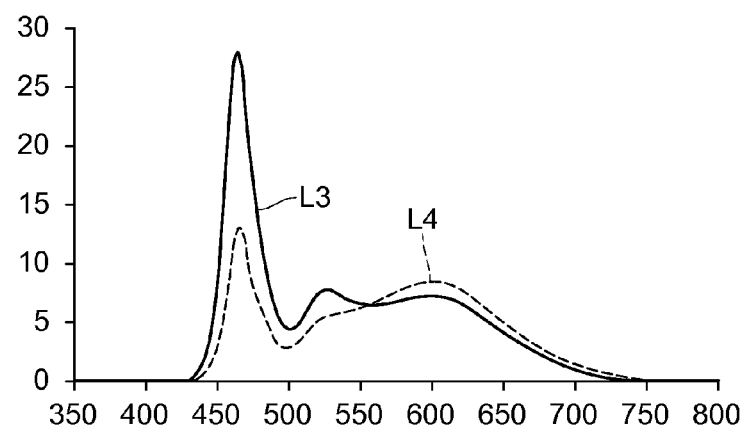
FIG. 20 is a spectrum diagram of the light emitting device in FIG. 7B when a concentration of a fluorescent material of the light conversion wall is smaller than a concentration of a fluorescent material of the light conversion filling.

For example, the second concentration of the second fluorescent material of the light conversion filling 40 is greater than the first concentration of the first fluorescent material of the light conversion wall 230. The spectrums of the light conversion filling 40 and the light conversion wall 230 are shown in FIG. 20, where the curve L3 shows the spectrum of the light conversion wall 230 having the first color temperature of about 6500K, and the curve L4 shows the spectrum of the light conversion filling 40 having the second color temperature of about 4000K.

As set forth above, the kind and concentration of the fluorescent material of the light conversion wall 230, and of the light conversion filling 40 can be designed according to various application requirements.

Figure 9A:
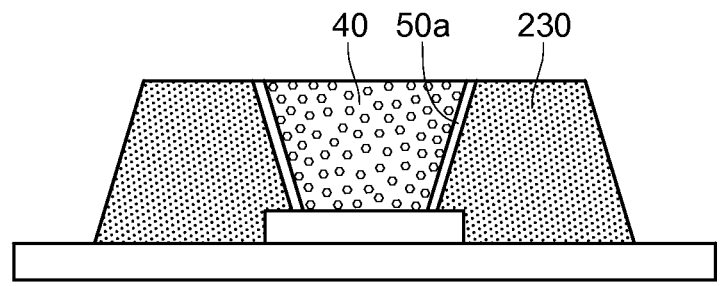
FIG. 9A is a sectional diagram of a reflection layer in the light emitting device according to an embodiment of the disclosure.
Figure 9B:
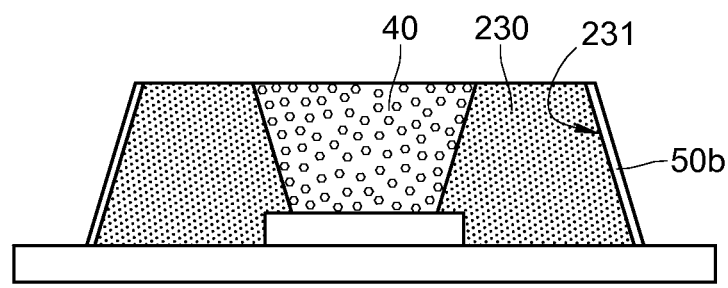
FIG. 9B is a sectional diagram of a reflection layer in the light emitting device according to an embodiment of the disclosure.
Figure 9C:
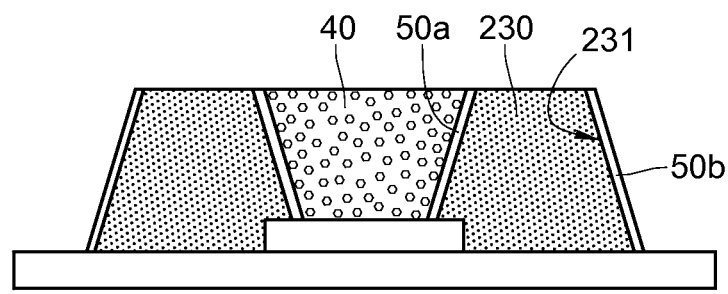
FIG. 9C is a sectional diagram of a reflection layer in the light emitting device according to an embodiment of the disclosure.

Furthermore, a reflection layer can be formed on at least one of the outer surface of the light conversion wall 230 and the interface of the light conversion wall 230 and the light conversion filling 40 in the disclosure. For example, a reflection layer 50a can be formed on the interface of the light conversion wall 230 and the light conversion filling 40 as shown in FIG. 9A. For example, a reflection layer 50b can be formed on the outer surface 231 of the light conversion wall 230 as shown in FIG. 9B. For example, a reflection layer 50a can be formed on the interface of the light conversion wall 230 and the light conversion filling 40, and a reflection layer 50b can be formed on the outer surface 231 of the light conversion wall 230, as shown in FIG. 9C. Thus, the light with the larger incidental angle emitted by the LED chip 130 are reflected and emitted, so as to redirect the light emitted by the Light emitting device in the same direction. The material of the reflection layer can be, for example, metal or semiconductor.

Figure 10A:
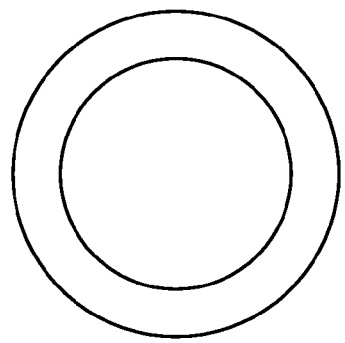
FIG. 10A is a top view of a shape of the light conversion wall according to an embodiment of the disclosure.
Figure 10B:
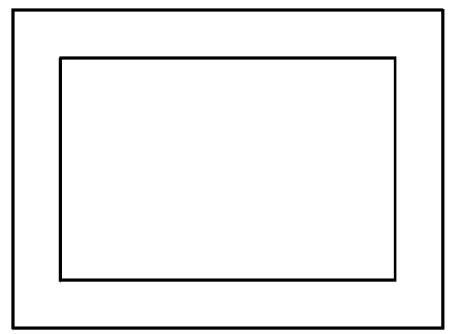
FIG. 10B is a top view of a shape of the light conversion wall according to an embodiment of the disclosure.
Figure 10C:
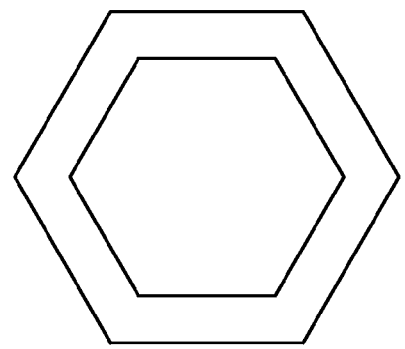
FIG. 10C is a top view of a shape of the light conversion wall according to an embodiment of the disclosure.

In the disclosure, the shape of the light conversion wall 230 in the top view can be, for example, a circle as shown in FIG. 10A, a quadrilateral as shown in FIG. 10B, or a polygon as shown in FIG. 10C, according to the various application requirements.

Figure 11A:
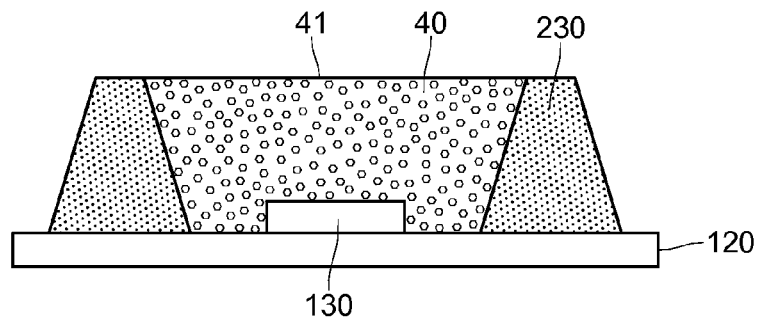
FIG. 11A is a schematic diagram of a shape of the liquid level of the light conversion filling according to an embodiment of the disclosure.
Figure 11B:
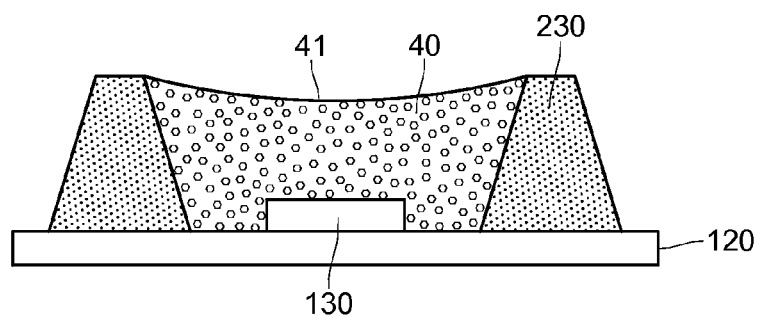
FIG. 11B is a schematic diagram of a shape of the liquid level of the light conversion filling according to an embodiment of the disclosure.
Figure 11C:
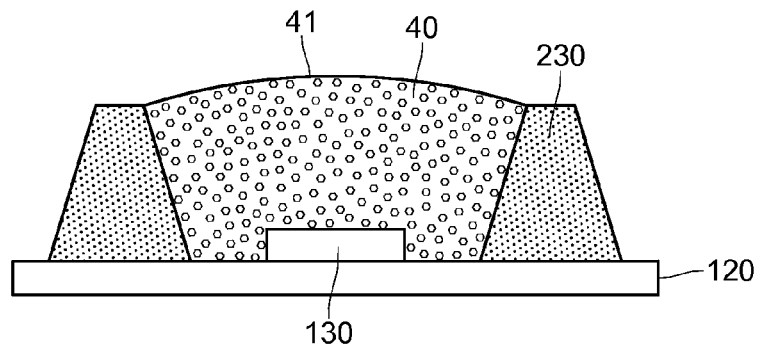
FIG. 11C is a schematic diagram of a shape of the liquid level of the light conversion filling according to an embodiment of the disclosure.

Moreover, the shape and height of the liquid level 41 of the light conversion filling 40 also can be designed according to the application requirements. For example, the liquid level 41 is a flat surface as shown in FIG. 11A, be a concave surface as shown in FIG. 11B, or be a convex surface as shown in FIG. 11C. When the liquid level 41 is a convex surface or a concave surface, the light emitted by the LED chip 130 can be focused in the same direction. For example, the liquid level 41 is higher than, equal to, or lower than the light conversion wall 230.

Figure 12A:
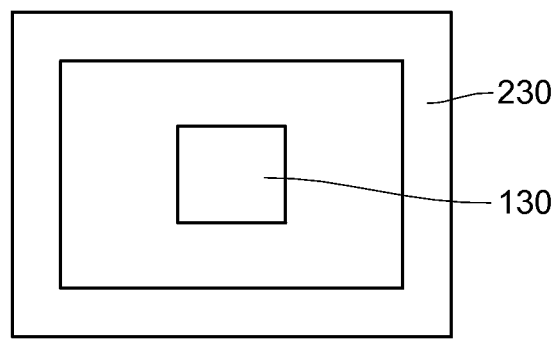
FIG. 12A is a schematic diagram of the location of the LED chip in the light emitting device according to an embodiment of the disclosure.
Figure 12B:
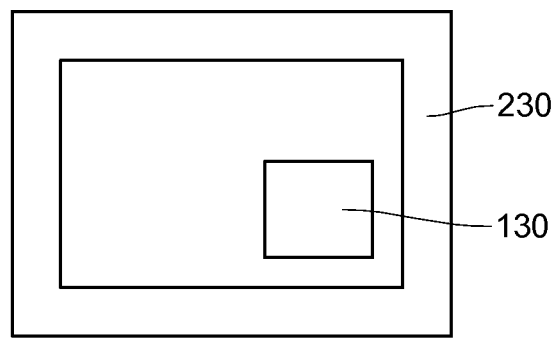
FIG. 12B is a schematic diagram of the location of the LED chip in the light emitting device according to an embodiment of disclosure.

The LED chip 130 can be formed at any preset location of the substrate 120 surrounded by the light conversion wall 230. For example, the LED chip 130 can be formed at the central point (one point on the central axis AL) of the substrate 120 surrounded by the light conversion wall 230 as shown in FIG. 12A. For example, the LED chip 130 can be formed at the location near by the light conversion wall 230 as shown in FIG. 12B.

Figure 13A:
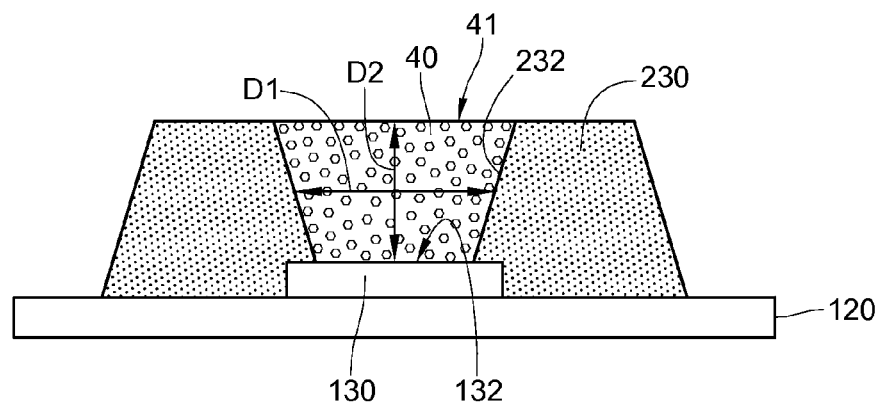
FIG. 13A is a schematic diagram of the width and height of the light conversion filling in the light emitting device according to an embodiment of disclosure.
Figure 13B:
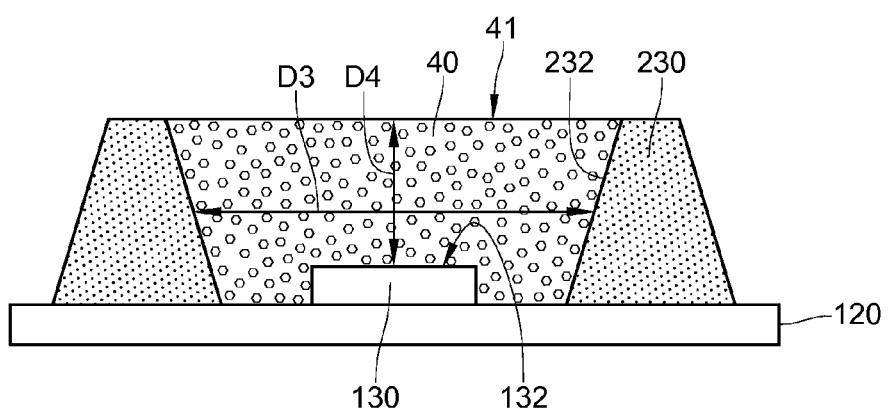
FIG. 13B is a schematic diagram of the width and height of the light conversion filling in the light emitting device according to an embodiment of disclosure.

Referring FIG. 13A and FIG. 13B, the light conversion filling 40 has an average width D1 or D3 and an average height D2 or D4. The average widths D1 and D3 are respectively an average value of a maximum width and a minimum width of the light conversion filling 40. The average height D2 and D4 are respectively an average value of a maximum height and a minimum height of the light conversion filling 40. The width of the light conversion filling 40 is the distance between two points on the inner surface 232 of the light conversion wall 230, and the two points are respectively at two sides of the axis line AL, and are at the same height. The height of the light conversion filling 40 is the distance between the surface 132 of the LED chip 130 and the liquid level 41 of the light conversion filling 40. A ratio of an average width D1 and an average height D2 is 0.1:10, and a ratio of an average width D3 and an average height D4 is 0.1:10.

Figure 14:
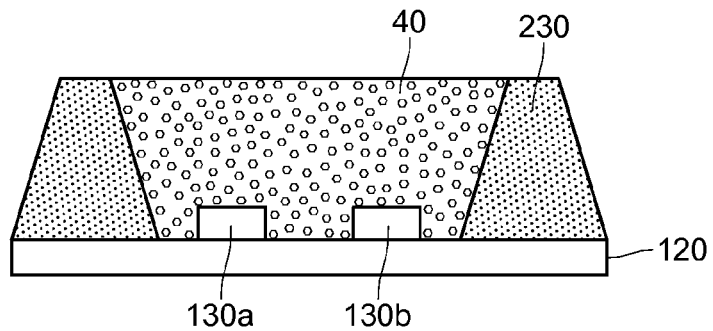
FIG. 14 is a schematic diagram of a plurality of LED chips surrounded by the light conversion wall in the light emitting device according to an embodiment of disclosure.

Besides, the light emitting device of the disclosure includes not only one LED chip disposed in the space surrounded by the light conversion wall 230, but also a plurality of LED chips. For example, a LED chip 130a and a LED chip 130b are disposed in the space on the substrate 120 surrounded by the light conversion wall 230, and are covered by the light conversion filling 40, as shown in FIG. 14. The color of the light emitted by the LED chips 130a and the color of the light emitted by the LED chip 130b can be the same or not the same.

Figure 15A:
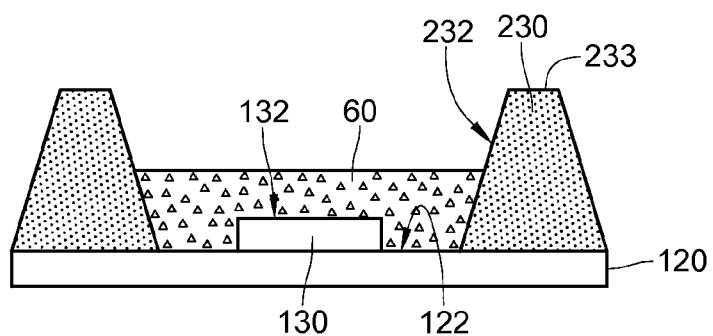
FIG. 15A and FIG. 15B are schematic diagrams showing a manufacture process of a diffusion layer in the light emitting device according to an embodiment of the disclosure.
Figure 15B:
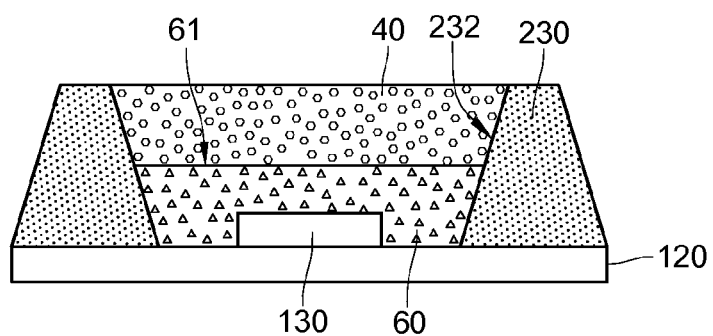

Furthermore, a light diffusion layer can be disposed in the space surrounded by the light conversion wall 230, before the light conversion filling 40 is disposed in the space. For example, as shown in FIG. 15A, the light diffusion layer 60 is disposed in the space surrounded by the light conversion wall 230 of the light emitting device of FIG. 5E, and covers the LED chip 130. The liquid level 61 of the light diffusion layer 60 is lower than the top surface 233 of the light conversion wall 230. Afterward, the light conversion filling 40 is disposed in the space surrounded by the light conversion wall 230 as shown in FIG. 15B. The light conversion filling 40 covers and joins the light diffusion layer 60. In one embodiment, the light diffusion layer 60 can be transparent. In another embodiment, the light diffusion layer 60 can be doped with particles.

Through the light diffusion layer 60, some of the normal light emitted by the light source may be transferred to two sides of the light emitting device. Thus, the concentration of the light conversion material of the light conversion filling 40 can be designed to be lower as compared with the light emitting device without the light diffusion layer 60. Moreover, the light conversion filling 40 is apart from the LED chip 130, so that the heat caused by the light source, for example, the LED chip 130, may not effect the emission of the light conversion filling 40.

Figure 16:
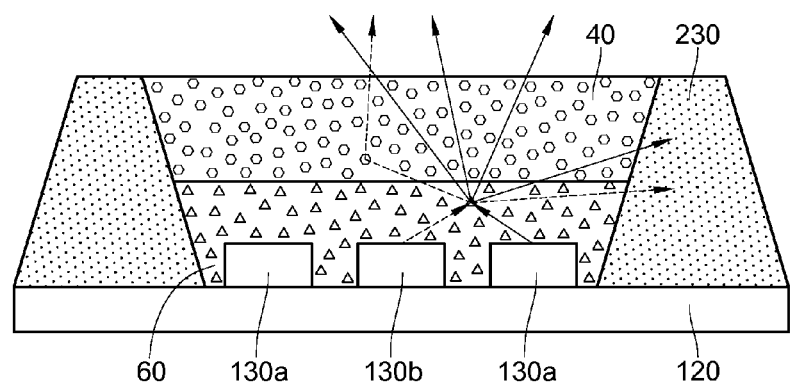
FIG. 16 is a schematic diagram of a light emitting device including a plurality of LED chips covered by a diffusion layer, according to an embodiment of the disclosure.

Similarly, a plurality of LED chips, for example, two LED chips 130a and one LED chip 130b, can be disposed in the space surrounded by the light conversion wall 230, and are covered by the light diffusion layer 60, as shown in FIG. 16. The color of the light emitted by the LED chips 130a can be different from the color of the light emitted by the LED chip 130b.

For example, the LED chips 130a are red LED chips, and the LED chip 130b is a blue LED chip. The red light emitted by the LED chip 130a and the blue light emitted by the LED chip 130b are mixed in the light diffusion layer 60, and then are mixed in the light conversion filling 40. Thus, the directivity of the light emitted by the light source may be reduced.

Figure 17:
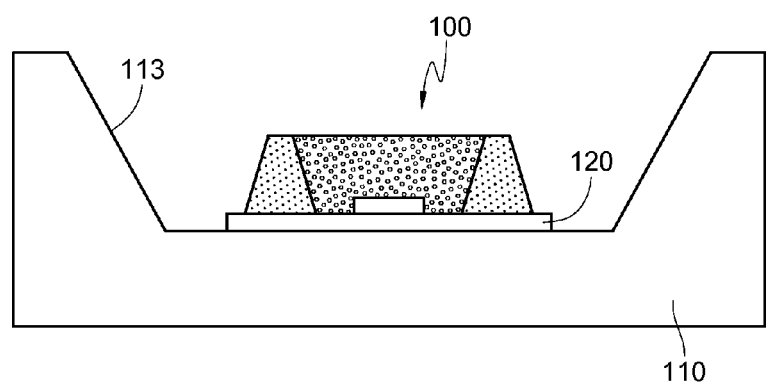
FIG. 17 is a sectional diagram of the light emitting device carried by a package carrier according to an embodiment of the disclosure.
Figure 18:
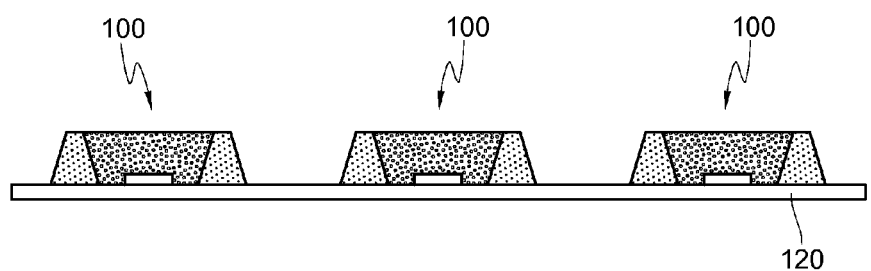
FIG. 18 is a sectional diagram of a plurality of light emitting units disposed on the substrates according to an embodiment of the disclosure.

In the disclosure, the LED structure unit 100, which includes the LED chip 130, the light conversion wall 230 and the light conversion filling 40, can be surrounded by the package carrier 110, for example, a cup carrier. For example, according to the light emitting device in FIG. 5F, the LED structure unit 100 including the LED chip 130, the light conversion wall 230 and the light conversion filling 40 can be surrounded by a cup carrier as shown in FIG. 17. A plurality of the LED structure units 100 also can be disposed on the same substrate 120 as shown in FIG. 18.

The material of the package carrier 110 can be, for example, ceramic, metal, plastic, or resin. Moreover, a reflection layer can be further formed on the surface 113 of the package carrier 110, so that the light emitted by the light emitting device can be reflected and redirected in the same direction. The material of the reflection layer on the surface 113 can be, for example, metal or semiconductor.

Figure 21:
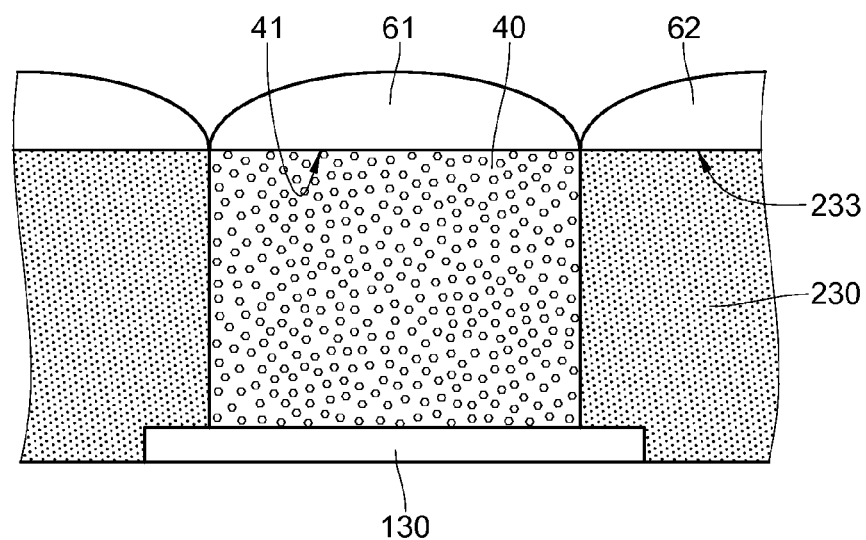
FIG. 21 is a sectional diagram of microlenses disposed on the light emitting device according to an embodiment of the disclosure.

In the disclosure, microlenses are respectively disposed on the light conversion filling 40 and the light conversion wall 230. As shown in FIG. 21, a first microlens 61 is disposed on the liquid level 41 of the light conversion filling 40, and a second microlens 62 is disposed on the top surface 233 of the light conversion wall 230. The first microlens 61 is used for redirecting the light emitted by the light conversion filling 40. The second microlens 62 is used for redirecting the light emitted by the light conversion wall 230, to travel along a first direction which is vertical to the surface 132 of the LED chip 130, and to travel along a second direction which is horizontal to the surface 132 of the LED chip 130.

Figure 22A:
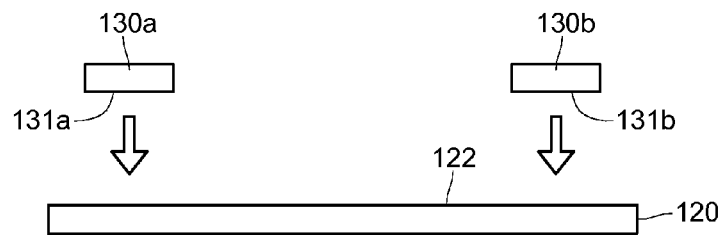
FIG. 22A to FIG. 22G are schematic diagrams showing a manufacture process of a light emitting device including a plurality of LED chips according to an embodiment of the disclosure.

FIG. 22A to FIG. 22G illustrate a manufacture process of a light emitting device of an embodiment of the disclosure. Firstly, a plurality of LED chips (the second LED chips), for example, a LED chip 130a and a LED chip 130b, are formed on a substrate 120, as shown in FIG. 22A. The surface 131a of the LED chip 130a and the surface 131b of the LED chip 130b join the surface 122 of the substrate 120.

Figure 22B:
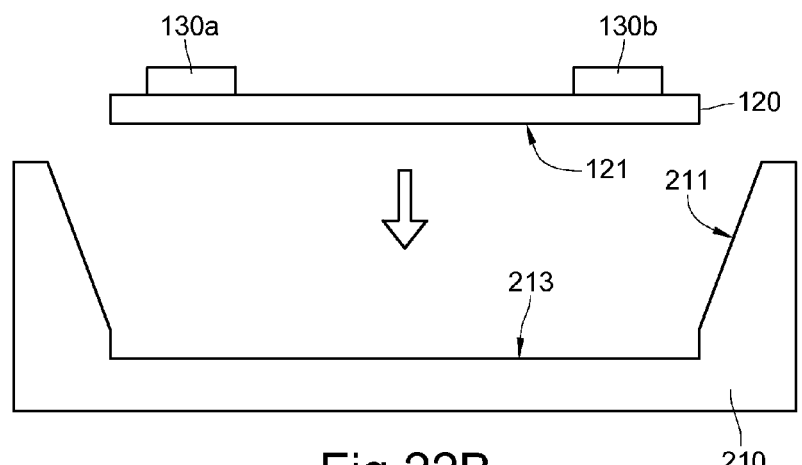

Subsequently, the first structure including the substrate 120 and the LED chips 130a and 130b is disposed in a mold 210 as shown in FIG. 22B. The mold 210 has a recess, and the recess has the side surface 211, the bottom surface 213 and an opening opposite to the bottom surface 213. Thus, the first structure can be disposed in the recess from the opening of the mold 210 after a hydrophobic layer is formed on the side surface 211 and the bottom surface 213 of the recess. The surface 121 which is opposite to the surface 122 is attached on the bottom surface 213. The side surface 211 can be designed to be vertical or not vertical to the bottom surface 213 according to various application requirements.

Figure 22C:
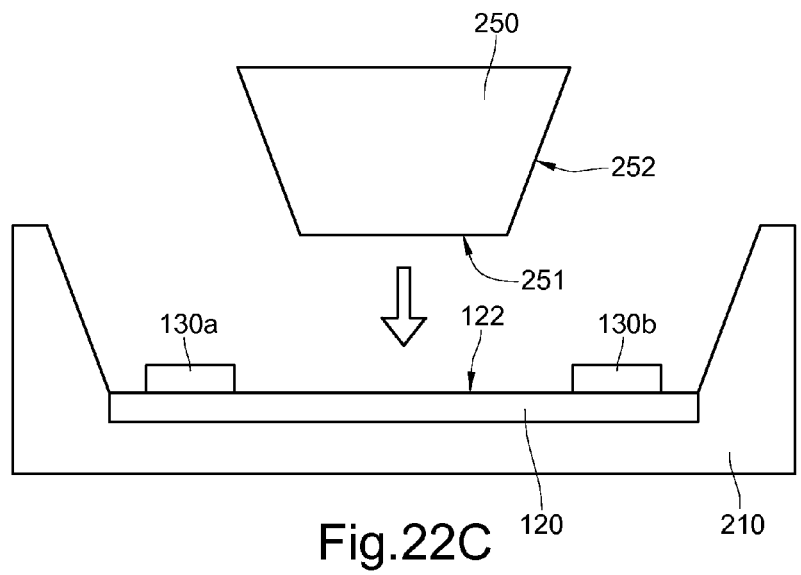
Figure 24:
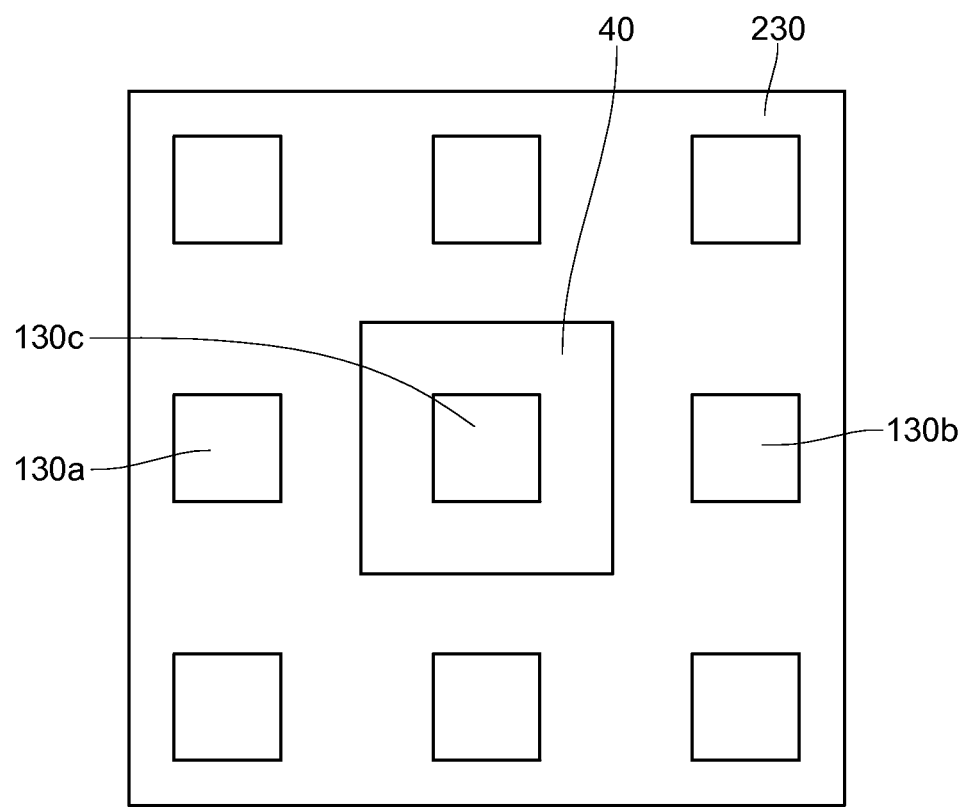
FIG. 24 is a top view of the light emitting device including a plurality of LED chips according to an embodiment of the disclosure.

As shown in FIG. 22C, a bulge 250 is disposed on the substrate 120 after a hydrophobic layer is coated on the bottom surface 251 and the side surface 252 of the bulge 250. The bottom surface 251 of the bulge 250 is attached on the surface 122 of the substrate 120. The LED chips 130a and 130b are at the two side of the bulge 250 as shown in FIG. 24. The side surface 252 of the bulge 250 can be designed to be vertical or not vertical to the substrate 120 according to various application requirements.

Figure 22D:
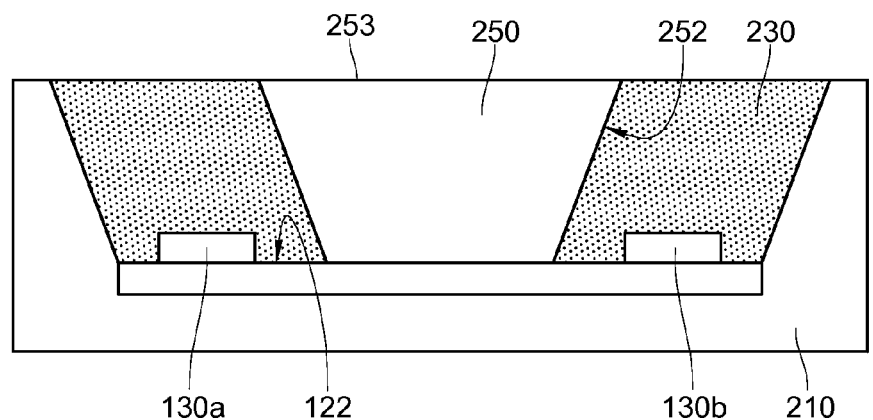
Figure 22E:
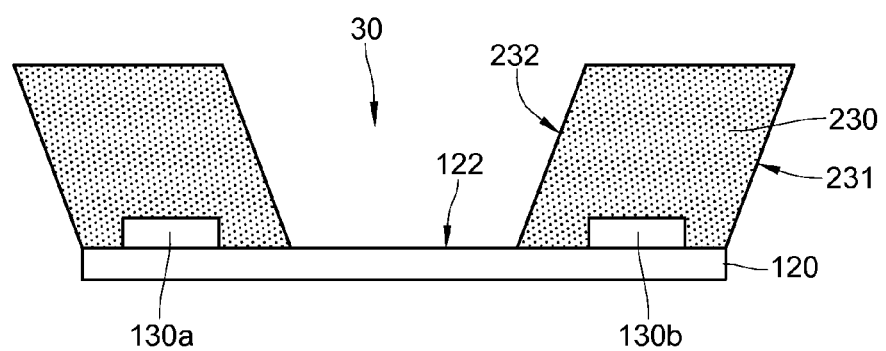
Figure 22F:
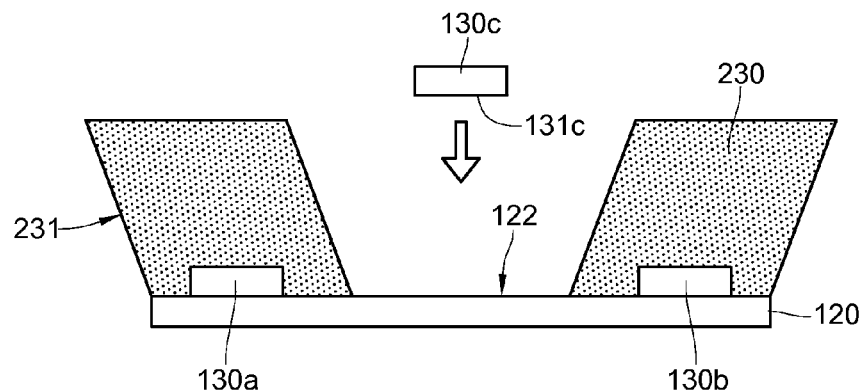

Subsequently, the first light conversion package gel serving as the light conversion wall 230 is disposed in the rest of the recess in the mold 210 as shown in FIG. 22D. The top surface 253 of the bulge 250 is, for example, at the same level as the liquid level of the first light conversion package gel serving as the light conversion wall 230. After the first light conversion package gel is solidified, the mold 210 and the bulge 250 are removed as shown in FIG. 22E. Herein, a space is formed between the inner surface 232 of the light conversion wall 230 and the surface 122 of the substrate 120, and has an opening 30 opposite to the surface 122 of the substrate 120. At least one LED chips 130c (the first LED chip) is further formed at a preset location of the surface 122 of the substrate 120 as shown in FIG. 22F. In this embodiment, the color of the light emitted by the LED chips 130a and 130b can be different from the color of the light emitted by the LED chip 130c, and the color of the light emitted by the LED chip 130a can be the same as the color of the light emitted by the LED chip 130b. For example, the LED chips 130a can be red LED chips, and the LED chip 130b can be a blue LED chip.

Figure 22G:
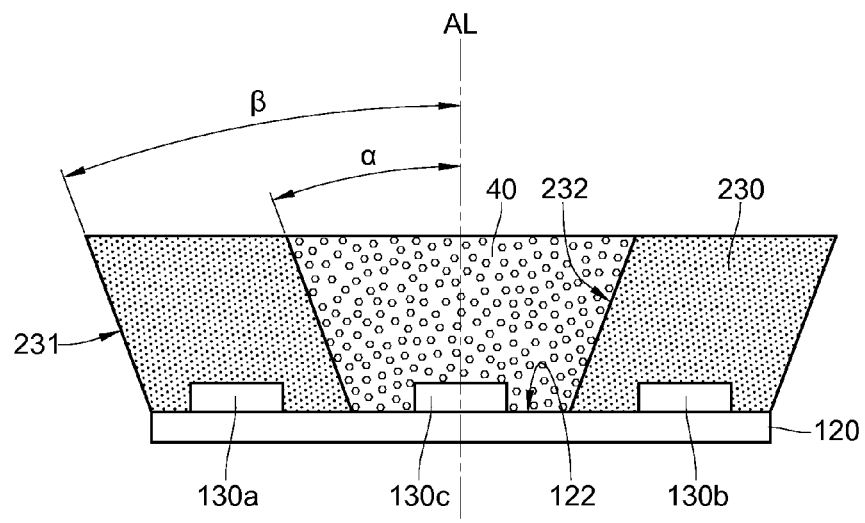
Figure 23A:
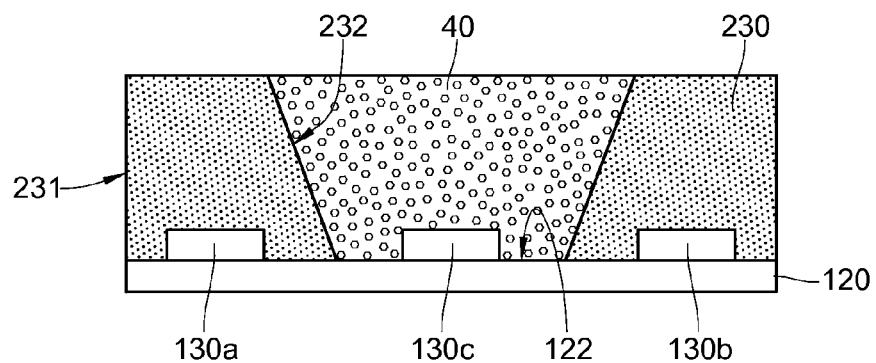
FIG. 23A is a sectional diagram of the light emitting device including a plurality of LED chips according to an embodiment of the disclosure.
Figure 23B:
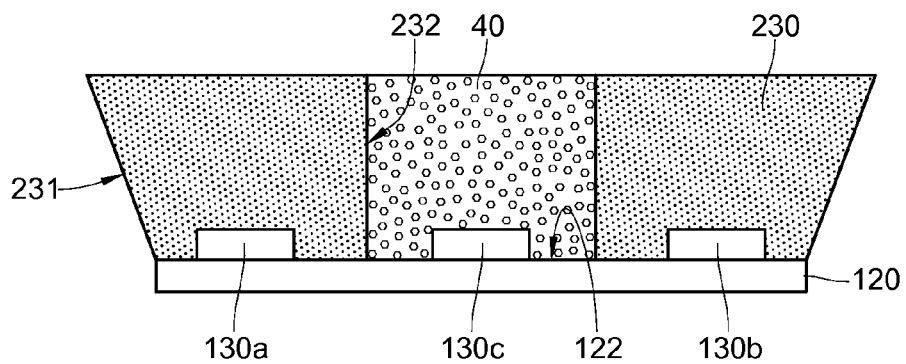
FIG. 23B is a sectional diagram of the light emitting device including a plurality of LED chips according to an embodiment of the disclosure.
Figure 23C:
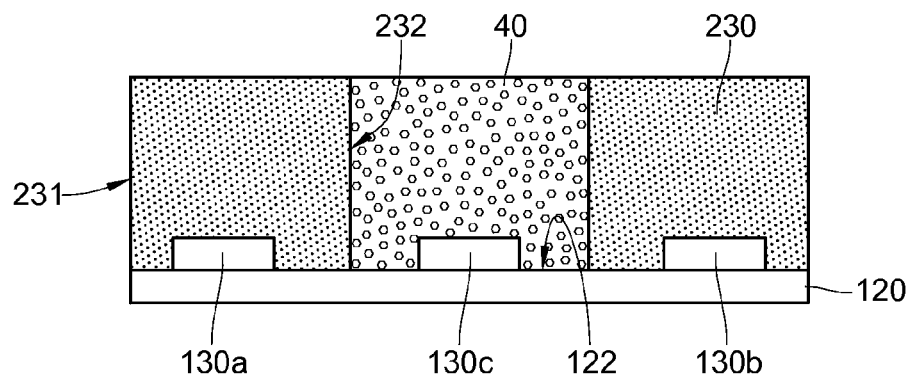
FIG. 23C is a sectional diagram of the light emitting device including a plurality of LED chips according to an embodiment of the disclosure.
Figure 23D:
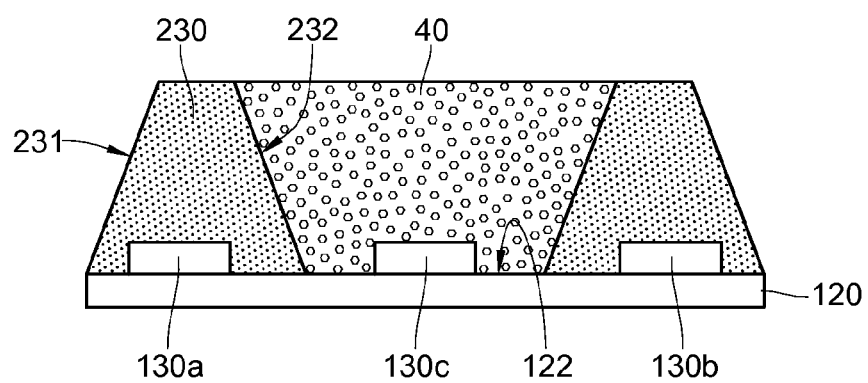
FIG. 23D is a sectional diagram of the light emitting device including a plurality of LED chips according to an embodiment of the disclosure.

As shown in FIG. 22G, a second light conversion package gel serving as the light conversion filling 40 is disposed in the space surrounded by the light conversion wall 230. The liquid level of the second light conversion package gel can be equal to, higher than, or lower than the liquid level of the first light conversion package gel according to the various application requirements.

Specifically, the inner surface 232 of the light conversion wall 230 and a central axis AL of the light conversion wall 230 have a first angle α therebetween, and the outer surface 231 of the light conversion wall 230 and the central axis AL of the light conversion wall 230 have a second angle β therebetween. The first angle α and the second angle β can be 0 degree or acute angles as shown in FIG. 22G and FIG. 23A to FIG. 23D, and the acute angle can be, for example, greater than 0 degree and equal to or smaller than 60 degree.

In this embodiments, a reflection layer 50 can be formed on at least one of the outer surface of the light conversion wall 230 and the interface of the light conversion wall 230 and the light conversion filling 40 as shown in FIG. 9A to FIG. 9C.

In this embodiment, a light diffusion layer can be disposed in the space surrounded by the light conversion wall 230, before the light conversion filling 40 is disposed in the space. The light diffusion layer can refer to the foregoing description in FIG. 15B and FIG. 16, thereby not describing repeatedly herein.

In this embodiment, a plurality of second structures can be disposed on the substrate 120, and every second structure includes the LED chips 130a and 130b, the light conversion wall 230 and the light conversion filling 40, as shown in FIG. 18.

In this embodiment, the LED structure unit including the substrate 120, the LED chips 130a and 130b, the light conversion wall 230 and the light conversion filling 40 can be disposed on a package carrier. Moreover, the fluorescent materials and shapes of the light conversion wall 230 and the light conversion filling can refer to the foregoing description, thereby not describing repeatedly herein.

Through the design of the first angle between the inner surface of the light conversion wall and the normal of the substrate, the design of the second angle between the outer surface of the light conversion wall and the normal of the substrate, the design of the kind and concentration of the fluorescent materials, the disposition of one or more LED chips, the color temperature associated to the light conversion wall is smaller than the color temperature associated to the light conversion filling in the light emitting device of the disclosure. Moreover, through the disposition of the reflection layer, the light emitted by the light emitting device in the disclosure can be reflected and redirected in the same direction. Therefore, the light emitting device in the disclosure may emit light having uniform color temperature.

What is claimed is:
1. A light emitting device, comprising:
 a substrate;
 a first light emitting diode (LED) chip, disposed on a surface of the substrate;

a wall, disposed on the surface of the substrate, and surrounding the first LED chip, wherein
a first angle between a central axis of the wall and an inner surface of the wall is 0 degree or is acute,
a second angle between the central axis of the wall and an outer surface of the wall is 0 degree or is acute,
the outer surface of the wall and the substrate has a space therebetween, and
the wall partially covers a top surface of the first LED chip; and
a light conversion filling, disposed on the first LED chip and surrounded by the wall, wherein
light is emittable from both the wall and the light conversion filling, the light emitted from the wall being of a first color temperature, and the light emitted from the light conversion filling being of a second color temperature, and
the first color temperature is higher than the second color temperature.

2. The light emitting device according to claim 1, wherein the wall comprises a first fluorescent material, the light conversion filling comprises a second fluorescent material, a first wavelength of light emitted by the first fluorescent material is different from a second wavelength of light emitted by the second fluorescent material.

3. The light emitting device according to claim 1, wherein the wall comprises a first fluorescent material, the light conversion filling comprises a second fluorescent material, the first fluorescent material and the second fluorescent material are the same, and a concentration of the first fluorescent material is different from a concentration of the second fluorescent material.

4. The light emitting device according to claim 1, wherein the light conversion filling has an average width and an average height, and a ratio of the average width and the average height is 0.1:10.

5. The light emitting device according to claim 1, wherein a refractive index of the light conversion filling is different from a refractive index of the wall.

6. The light emitting device according to claim 1, wherein the light conversion filling partially covers the substrate surrounded by the wall.

7. The light emitting device according to claim 1, further comprising:
a reflection layer, formed on at least one of an outer surface of the wall and an interface of the wall and the light conversion filling.

8. The light emitting device according to claim 1, further comprising:
a light diffusion layer, covering the first LED chip, covered by the light conversion filling, and surrounded by the wall.

9. The light emitting device according to claim 8, further comprising:
a plurality of second LED chips, disposed on the surface of the substrate, covered by the light diffusion layer, and a wavelength of light emitted by the plurality of second LED chips being different from a wavelength of light emitted by the first LED chip.

10. The light emitting device according to claim 1, further comprising:
a plurality of second LED chips, disposed on the surface of the substrate, and covered by the wall.

11. The light emitting device according to claim 10, wherein a wavelength of light emitted by the first LED chip is different from a wavelength of light emitted by the plurality of second LED chips.

12. The light emitting device according to claim 1, wherein a width of the wall is reduced gradually from the substrate toward outside along a normal of the substrate.

13. The light emitting device according to claim 1, wherein a surface of the light conversion filling protrudes away from the substrate or recesses toward the substrate.

14. A fabricating method of a light emitting device, comprising:
disposing a first LED chip on a surface of a substrate;
forming a wall on the surface of the substrate, such that
the wall surrounds the first LED chip, and partially covers a top surface of the first LED chip, and
an outer surface of the wall and the substrate have a space therebetween, light emitted from the wall being of a first color temperature; and
forming a light conversion filling in a space surrounded by the wall, and on the first LED chip, light emitted from the light conversion filling being of a second color temperature that is lower than the first color temperature.

15. The fabricating method according to claim 14, wherein a first angle between a central axis of the wall and an inner surface of the wall is 0 degree or is acute, a second angle between the central axis of the wall and the outer surface of the wall is 0 degree or is acute.

16. The fabricating method according to claim 14, wherein the light conversion filling partially covers the substrate surrounded by the wall.

17. The fabricating method according to claim 14, further comprising:
forming a plurality of second LED chips on the surface of the substrate, wherein the wall covers the plurality of second LED chips.

18. The fabricating method according to claim 17, wherein a wavelength of light emitted by the first LED chip is different from a wavelength of light emitted by the plurality of second LED chips.

19. The fabricating method according to claim 14, wherein the wall comprising a first fluorescent material, the light conversion filling comprising a second fluorescent material, a first wavelength of light emitted by the first fluorescent material is different from a second wavelength of light emitted by the second fluorescent material.

20. The fabricating method according to claim 14, wherein the wall comprising a first fluorescent material, the light conversion filling comprising a second fluorescent material, the first fluorescent material and the second fluorescent material are the same, and a first concentration of the first fluorescent material is different from a second concentration of the second fluorescent material.

21. The fabricating method according to claim 14, wherein a refractive index of the light conversion filling is different from a refractive index of the wall.

22. The fabricating method according to claim 14, wherein the light conversion filling has an average width and an average height, and a ratio of the average width and the average height is 0.1:10.

23. The fabricating method according to claim 14, further comprising:
forming a reflection layer on at least one of an outer surface of the wall and an interface of the wall and the light conversion filling.

24. The fabricating method according to claim 14, further comprising:
forming a light diffusion layer on the first LED chip, wherein the light diffusion layer is surrounded by the wall and is covered by the light conversion filling.

25. The fabricating method according to claim 24, further comprising:
   forming a plurality of second LED chips on the surface of the substrate, wherein the light diffusion layer covers the plurality of second LED chips, and a wavelength of light emitted by the plurality of second LED chips is different from a wavelength of light emitted by the first LED chip.

26. The fabricating method according to claim 14, wherein a width of the wall is reduced gradually from the substrate toward outside along a normal of the substrate.

27. The fabricating method according to claim 14, wherein a surface of the light conversion filling protrudes away from the substrate or recesses toward the substrate.

* * * * *